(12) United States Patent
Kurosaka et al.

(10) Patent No.: US 10,389,088 B2
(45) Date of Patent: Aug. 20, 2019

(54) SEMICONDUCTOR LIGHT EMITTING ELEMENT

(71) Applicant: HAMAMATSU PHOTONICS K.K., Hamamatsu-shi, Shizuoka (JP)

(72) Inventors: Yoshitaka Kurosaka, Hamamatsu (JP); Yuu Takiguchi, Hamamatsu (JP); Takahiro Sugiyama, Hamamatsu (JP); Kazuyoshi Hirose, Hamamatsu (JP); Yoshiro Nomoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/556,429

(22) PCT Filed: Mar. 11, 2016

(86) PCT No.: PCT/JP2016/057835
§ 371 (c)(1),
(2) Date: Sep. 7, 2017

(87) PCT Pub. No.: WO2016/148075
PCT Pub. Date: Sep. 22, 2016

(65) Prior Publication Data
US 2018/0109075 A1   Apr. 19, 2018

(30) Foreign Application Priority Data
Mar. 13, 2015   (JP) .................. 2015-051220

(51) Int. Cl.
*H01S 5/00* (2006.01)
*H01S 5/183* (2006.01)
(Continued)

(52) U.S. Cl.
CPC .......... *H01S 5/18358* (2013.01); *H01S 5/105* (2013.01); *H01S 5/42* (2013.01);
(Continued)

(58) Field of Classification Search
CPC ...... H01S 5/18358; H01S 5/423; H01S 5/187; H01S 5/183; H01S 5/18319; H01S 5/105;
(Continued)

(56) References Cited

U.S. PATENT DOCUMENTS 8,711,895 B2 * 4/2014 Noda ............... H01S 5/105
372/43.01
9,531,160 B2 * 12/2016 Noda ............... H01S 5/18
(Continued)

FOREIGN PATENT DOCUMENTS

JP   2006-100776 A   4/2006
JP   WO2014136955   *   9/2014
(Continued)

OTHER PUBLICATIONS

WO2014136955 (English translation).*
(Continued)

*Primary Examiner* — Tod T Van Roy
*Assistant Examiner* — Delma R Fordé
(74) *Attorney, Agent, or Firm* — Drinker Biddle & Reath LLP

(57) ABSTRACT

In a semiconductor light emitting element provided with an active layer 4, a pair of cladding layers 2, 7 between which the active layer 4 is interposed, and a phase modulation layer 6 optically coupled to the active layer 4, the phase modulation layer 6 includes a base layer 6A and a plurality of different refractive index regions 6B having different refractive indices from the base layer 6A. When an XYZ orthogonal coordinate system having a thickness direction of the phase modulation layer 6 as a Z-axis direction is set and a square lattice of a virtual lattice constant a is set in an XY plane, each of the different refractive index regions 6B is disposed so that a centroid position G thereof is shifted from
(Continued)

a lattice point position in a virtual square lattice by a distance r, and the distance r is 0<r≤0.3a.

13 Claims, 51 Drawing Sheets

(51) Int. Cl.
  *H01S 5/42* (2006.01)
  *H01S 5/10* (2006.01)
  H01S 5/187 (2006.01)
  H01S 5/0683 (2006.01)
(52) U.S. Cl.
  CPC ............ *H01S 5/423* (2013.01); *H01S 5/0683* (2013.01); *H01S 5/187* (2013.01); *H01S 2301/18* (2013.01); *H01S 2301/20* (2013.01)
(58) Field of Classification Search
  CPC .... H01S 5/18; H01S 2301/18; H01S 2301/20; H01L 2924/40402
  See application file for complete search history.

(56) References Cited

U.S. PATENT DOCUMENTS

| | | | |
|---|---|---|---|
| 9,614,352 B2* | 4/2017 | Takiguchi | H01S 5/12 |
| 9,685,764 B2* | 6/2017 | Fuchida | H01S 3/1055 |
| 9,698,562 B2* | 7/2017 | Watanabe | G02F 1/3558 |
| 9,748,737 B2* | 8/2017 | Takiguchi | H01S 5/105 |
| 9,991,669 B2* | 6/2018 | Hirose | H01S 5/0085 |
| 2004/0247009 A1* | 12/2004 | Noda | H01S 5/105 372/99 |
| 2009/0010298 A1* | 1/2009 | Kiyota | B82Y 20/00 372/96 |
| 2009/0074024 A1* | 3/2009 | Noda | G11B 7/0903 372/50.12 |
| 2009/0268291 A1* | 10/2009 | Wang | G02B 5/3058 359/485.01 |
| 2009/0285255 A1* | 11/2009 | Sakai | B82Y 20/00 372/50.124 |
| 2011/0188526 A1* | 8/2011 | Noda | H01S 5/105 372/41 |
| 2014/0247852 A1* | 9/2014 | Noda | H01S 5/105 372/45.013 |
| 2016/0020580 A1* | 1/2016 | Takiguchi | H01S 5/105 372/44.011 |
| 2016/0036201 A1* | 2/2016 | Takiguchi | H01S 5/12 359/492.01 |
| 2018/0026419 A1* | 1/2018 | Hirose | H01S 5/0085 353/22 |
| 2019/0013647 A1* | 1/2019 | Higuchi | H01S 5/18394 |
| 2019/0067907 A1* | 2/2019 | Noda | H01S 5/183 |

FOREIGN PATENT DOCUMENTS

| | | |
|---|---|---|
| JP | 2014-236127 A | 12/2014 |
| WO | WO-2014/136607 A1 | 9/2014 |
| WO | WO-2014/136955 A1 | 9/2014 |
| WO | WO-2014/136962 A1 | 9/2014 |

OTHER PUBLICATIONS

WO2014136955 (Drawings).*
International Preliminary Report on Patentability dated Sep. 28, 2017 for PCT/JP2016/057835.

* cited by examiner

Fig.3

| | MATERIAL | CONDUCTIVITY TYPE | THICKNESS (nm) |
|---|---|---|---|
| CONTACT LAYER 8 | GaAs | P | 50~500 (200) |
| UPPER CLADDING LAYER 7 | AlGaAs | P | $1 \times 10^3 \sim 3 \times 10^3$ ($2 \times 10^3$) |
| PHASE MODULATION LAYER 6 (DIFFRACTION GRATING LAYER) | BASE LAYER 6A:GaAs DIFFERENT REFRACTED INDEX REGION 6B:AlGaAs | - | 50~200 (100) |
| UPPER LIGHT GUIDE LAYER 5 | UPPER LAYER:GaAs | - | 10~200 (50) |
| | LOWER LAYER:AlGaAs | P(I) | 10~100 (50) |
| ACTIVE LAYER 4 | MQW: AlGaAs/InGaAs | - | 10~100 (30) |
| LOWER LIGHT GUIDE LAYER 3 | AlGaAs | - | 0~300 (150) |
| LOWER CLADDING LAYER 2 | AlGaAs | N | $1 \times 10^3 \sim 3 \times 10^3$ ($2 \times 10^3$) |
| SEMICONDUCTOR SUBSTRATE 1 | GaAs | N | 80×350 (150) |

Fig.8
(A)
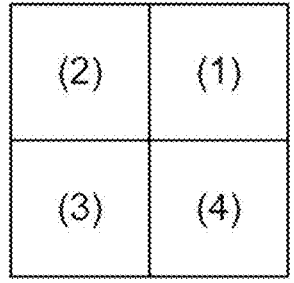
ORIGINAL IMAGE
(B)
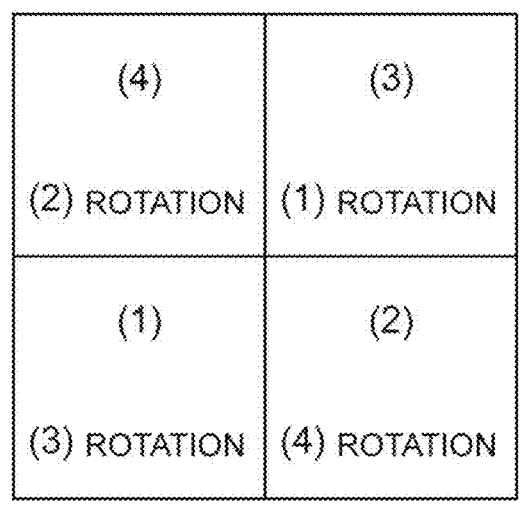
OBTAINED BEAM PATTERN

*Fig.10*
(A)
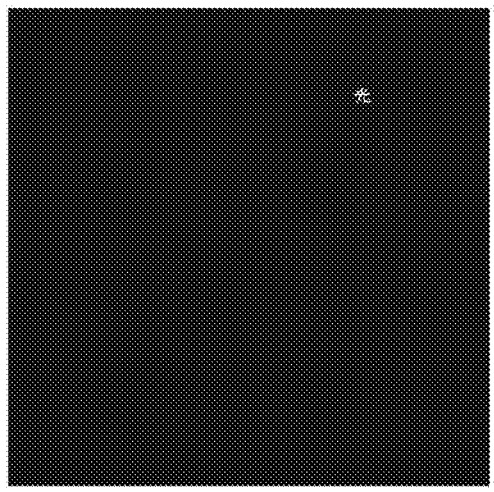
(B)
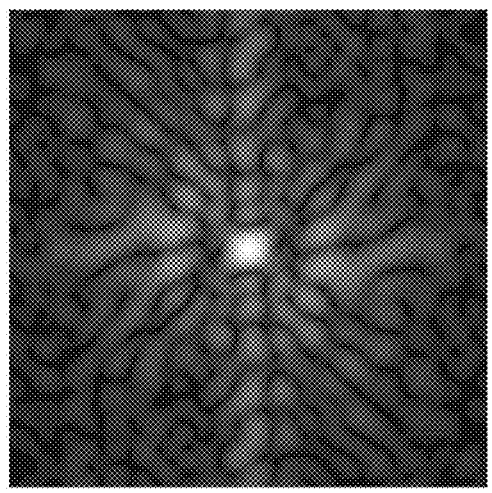
(C)
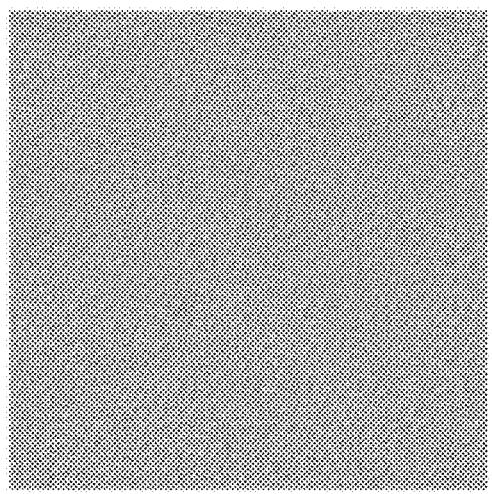

Fig.11
(A)
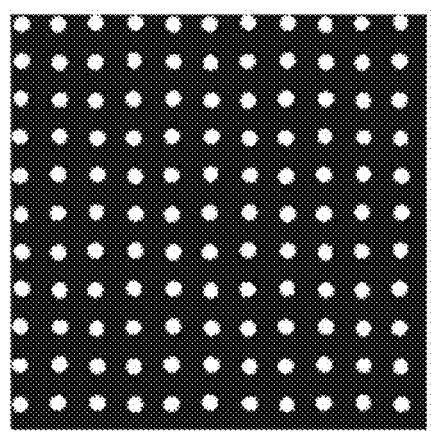
(B)
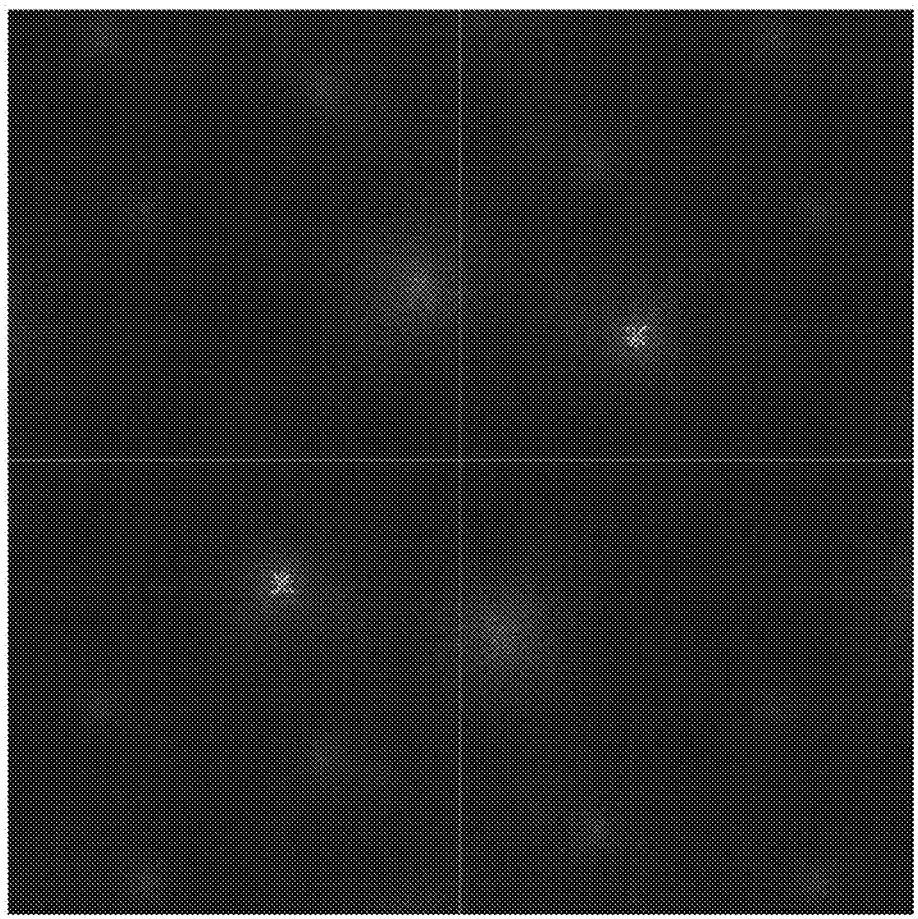

*Fig.13*
(A)
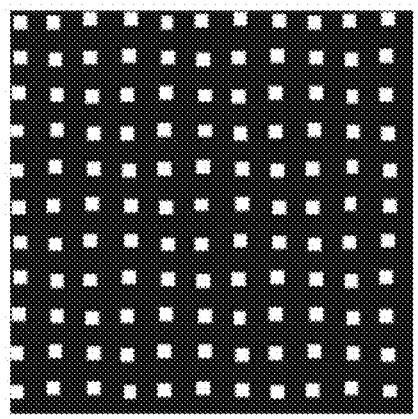
(B)
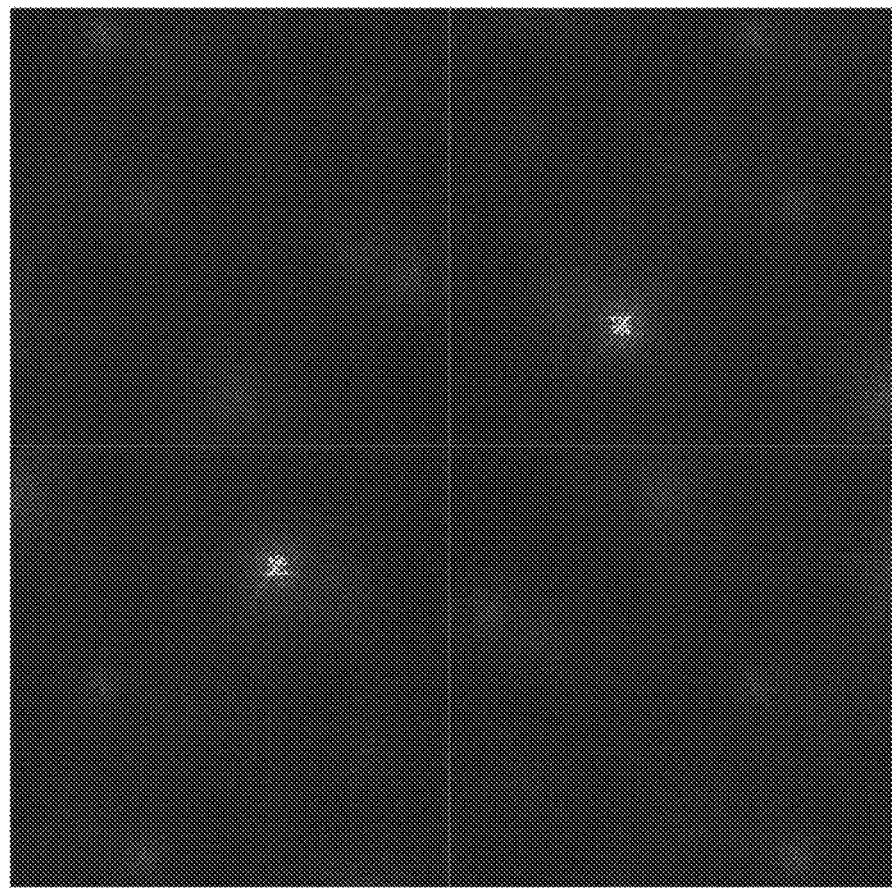

*Fig.15*
(A)
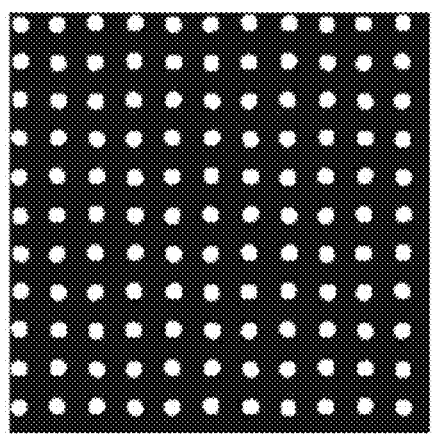
(B)
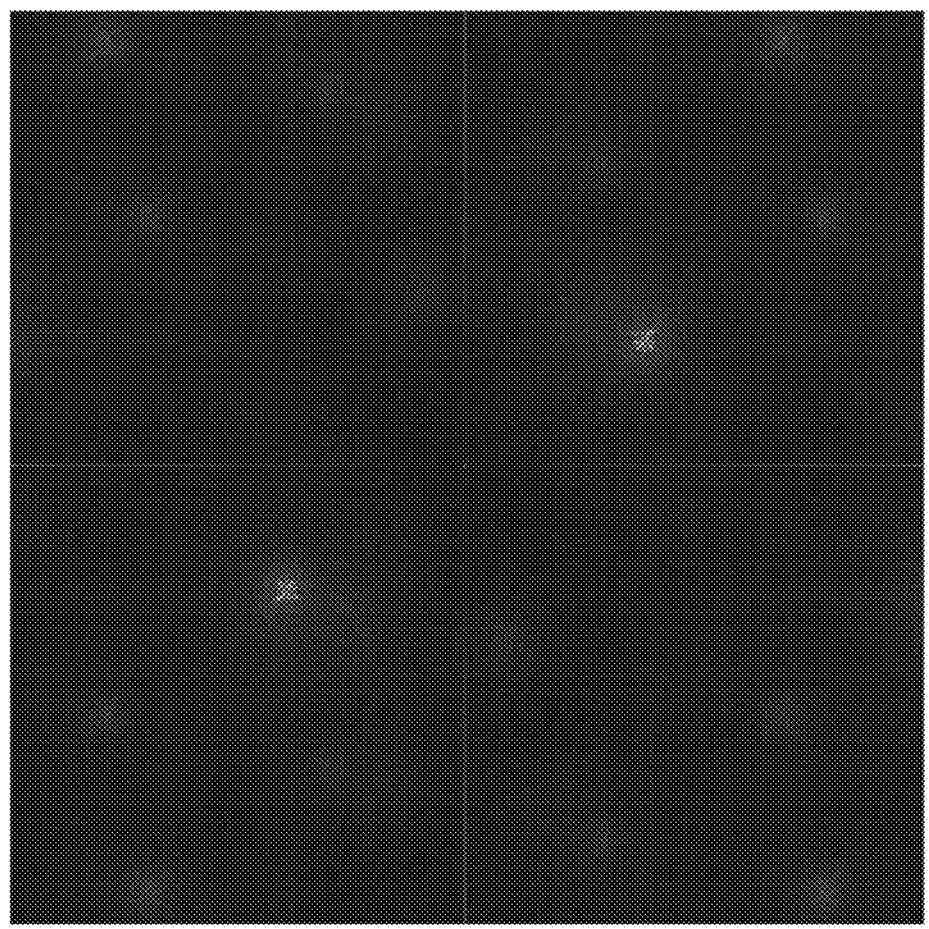

Fig. 17 (EMBODIMENT 1)

Fig. 18 (EMBODIMENT 2)

Fig.19 (EMBODIMENT 3)

10°

SHADE OF COLOR INDICATES PHASE
AS SHOWN IN COLOR BAR ABOVE

10°

10°

10°

SEMICONDUCTOR LIGHT EMITTING ELEMENT

TECHNICAL FIELD

The present invention relates to a semiconductor light emitting element.

BACKGROUND ART

In the past, the inventors of the present application have proposed a semiconductor light emitting element disclosed in Patent Literature 1. The semiconductor light emitting element disclosed in Patent Literature 1 includes an active layer, a pair of cladding layers between which the active layer is interposed, and a phase modulation layer optically coupled to the active layer, and the phase modulation layer includes a base layer and a plurality of different refractive index regions having different refractive indices from the basic layer. In a case where a square lattice is set in the phase modulation layer, the different refractive index region (main hole) is disposed so as to exactly coincide with a lattice point of a hole lattice. An auxiliary different refractive index region (sub hole) is provided around the different refractive index region, and light having a predetermined beam pattern can be emitted.

CITATION LIST

Patent Literature

Patent Literature 1: International Publication No. WO 2014/136962

SUMMARY OF INVENTION

Technical Problem

However, in the case of a structure having a main hole and a sub-hole, it is difficult to highly control positional accuracy therebetween, and it is also difficult to obtain high definition of patterns such as shortening of lattice interval, and thus there is a problem that a desired beam pattern is difficult to obtain.

The present invention has been made in an effort to solve the above problems and an object of the present invention is to provide a semiconductor light emitting element capable of obtaining a desired beam pattern more easily than before.

Solution to Problem

In order to solve the problems described above, a first semiconductor light emitting element includes: an active layer; a pair of cladding layers between which the active layer is interposed; and a phase modulation layer optically coupled to the active layer, wherein the phase modulation layer includes: a base layer; and a plurality of different refractive index regions having different refractive indices from the base layer, when an XYZ orthogonal coordinate system having a thickness direction of the phase modulation layer as a Z-axis direction is set and a square lattice of a virtual lattice constant a is set in an XY plane, each of the different refractive index regions is disposed so that a centroid position thereof is shifted from a lattice point position in the virtual square lattice by a distance r, and the distance r is $0 < r \leq 0.3a$.

In the case of this structure, the centroid position of the planar shape of the different refractive index region is shifted by the distance r within the above range, whereby the phase difference of the beam changes according to the direction of the vector from the position of the lattice point toward the centroid position of the planar shape of the different refractive index region. That is, by just changing the centroid position, it is possible to control the phase difference of the beams emitted from the different refractive index regions, and the beam pattern formed as a whole can be formed to have a desired shape. At this time, the lattice point of the virtual square lattice may be outside the different refractive index region, or the lattice point of the virtual square lattice may be included inside the different refractive index region.

In such a semiconductor light emitting element, only a single different refractive index region is present at least inside the circle having a radius of 0.62a from the lattice point of the virtual square lattice.

In addition, in a second semiconductor light emitting element, in the phase modulation layer, all the different refractive index regions have, in the XY plane, (a) the same figure, (b) the same area, and/or (c) the same distance r, and (d) the plurality of different refractive index regions are capable of being overlapped by a translating operation, or a translating operation and a rotating operation.

By providing one or more of these conditions (a) to (d), it is possible to suppress the generation of a noise in the beam pattern and zeroth order light which becomes a noise. Here, the zeroth order light is an optical output that is output in parallel to a Z direction, and is light that is not phase-modulated in the phase modulation layer. In the phase modulation layer of the present invention, when $r = 0$ is set as the distance r between the lattice point of the virtual square lattice and the different refractive index region, it functions as a photonic crystal laser of a square lattice which is output in parallel to the Z direction. In the present invention, the case of $r = 0$ is not included. Note that the present invention can also be regarded as realizing the control of a beam pattern by perturbation applied to each hole position of the square lattice photonic crystal laser including the square lattice photonic crystal which is a periodic structure. In other words, the formation of a standing wave state in a direction parallel to the square lattice is based on the same principle as the square lattice photonic crystal, but by applying the perturbation designed at each hole position based on the present invention, a desired phase modulation can be applied to a plane wave diffracted in a direction perpendicular to the square lattice, whereby a desired beam pattern can be obtained. From the aforementioned viewpoint, the structure formed by the different refractive region included in the phase modulation layer of the present invention is not a periodic structure but is called a substantially periodic structure.

In addition, in a third semiconductor light emitting element, a shape of each of the different refractive index regions in the XY plane has a rotational symmetry. In a fourth semiconductor light emitting element, the shape of each of the different refractive index regions in the XY plane is a perfect circle, a square, a regular hexagon, a regular octagon, or a regular hexadecagon. Compared to rotationally asymmetric figures, these figures can be patterned with high accuracy because they are less affected even if the pattern is shifted in the rotating direction.

In addition, in a fifth semiconductor light emitting element, the shape of each of the different refractive index regions in the XY plane has a mirror image symmetry (line symmetry). In a sixth semiconductor light emitting element, wherein the shape of each of the different refractive index regions in the XY plane is a rectangle, an ellipse, or a shape in which a part of two circles or ellipses overlap each other. Compared with rotationally asymmetric figures, these figures can be patterned with high accuracy because the position of the line segment serving as the line symmetric reference can be clearly known.

In a seventh semiconductor light emitting element, the shape of each different refractive index region in the XY plane is not limited to the above-described figures. For example, in a seventh semiconductor light emitting element, the shape of each of the different refractive index regions in the XY plane is a trapezoidal shape, a shape (egg shape) in which a dimension in a minor axis direction in the vicinity of one end portion along a major axis of an ellipse is deformed so as to be smaller than a dimension in a minor axis direction in the vicinity of another end portion, or a shape (tear shape) in which one end portion along a major axis of an ellipse is deformed to a pointed end protruding along a major axis direction thereof. Even with such a figure, the phase of the beam can be changed by shifting the centroid position of the planar shape of the different refractive index region from the lattice point by the distance r.

In an eighth semiconductor light emitting element, when an effective refractive index of the phase modulation layer is n, a wavelength $\lambda_0$ (=a×n) selected by the phase modulation layer falls within an emission wavelength range of the active layer. The phase modulation layer (diffraction grating layer) can select the wavelength 4 from the emission wavelengths of the active layer and output the selected wavelength $\lambda_0$ to the outside.

In a ninth semiconductor light emitting element, when an effective refractive index of the phase modulation layer is n, a wavelength $\lambda_0$ (=$2^{0.5}$×a×n) selected by the phase modulation layer falls within an emission wavelength range of the active layer. The phase modulation layer (diffraction grating layer) can select the wavelength $\lambda_0$ from the emission wavelengths of the active layer and output the selected wavelength 4 to the outside.

In a tenth semiconductor light emitting element, a beam pattern emitted from the semiconductor light emitting element includes at least one: spot, straight line, cross, lattice pattern, or character, a complex amplitude distribution F(X, Y) obtained by performing two-dimensional Fourier transformation on a specific region of the beam pattern in the XY plane is expressed as follows, by using an intensity distribution I(X, Y) in the XY plane and a phase distribution P(X, Y) in the XY plane, with j as an imaginary unit: F(X, Y)=I(X, Y)×exp{P(X, Y) j}, wherein, in the phase modulation layer, when $\varphi$ is an angle formed by an X axis and a direction from each lattice point of the virtual square lattice to the centroid of the corresponding different refractive index region, a constant is C, (x, y) is a position of a virtual square lattice point at an xth position in an X-axis direction and a yth position in a Y-axis direction, and $\varphi$(x, y) is an angle at a position (x, y), $\varphi$(x, y)=C×P(X, Y).

Characters configured by beam patterns are meanings of characters of countries in the world, such as alphabet, Japanese, Chinese, German, or the like. In the case of Japanese, the characters include kanji, hiragana, and katakana. In the case of displaying such a character, the beam pattern may be Fourier-transformed and the centroid position of the different refractive index region may be shifted from the lattice point position of the virtual square lattice in the direction of the angle $\varphi$ according to the phase part of the complex amplitude.

Advantageous Effects of Invention

According to the semiconductor light emitting element of the present invention, a desired beam pattern can be easily obtained.

BRIEF DESCRIPTION OF DRAWINGS

FIG. 3 is a table showing a relationship between a material, a conductivity type, and a thickness (nm) of each compound semiconductor layer constituting a laser element.

FIG. 8-(A) is a diagram for explaining the arrangement of original patterns before Fourier transformation, and FIG. 8-(B) is a diagram for explaining the arrangement of beam patterns obtained according to an embodiment.

FIG. 10-(A) is a diagram for describing an original pattern used in the embodiment, FIG. 10-(B) is a diagram for describing an intensity distribution obtained by performing two-dimensional Fourier transformation on the original pattern used in the embodiment, and FIG. 10-(C) is a diagram for describing a phase distribution obtained by two-dimensional Fourier transformation on the original pattern used in the embodiment.

FIG. 11-(A) is a diagram showing a part extracted from a different refractive index distribution according to a first embodiment, and FIG. 11-(B) is a diagram illustrating a beam pattern obtained in the first embodiment.

FIG. 13-(A) is a diagram showing a part extracted from a different refractive index distribution according to a second embodiment, and FIG. 13-(B) is a diagram illustrating a beam pattern obtained in the second embodiment.

FIG. 15-(A) is a diagram showing a part extracted from a different refractive index distribution according to a third embodiment, and FIG. 15-(B) is a diagram illustrating a beam pattern obtained in the third embodiment.

DESCRIPTION OF EMBODIMENTS

Figure 1:
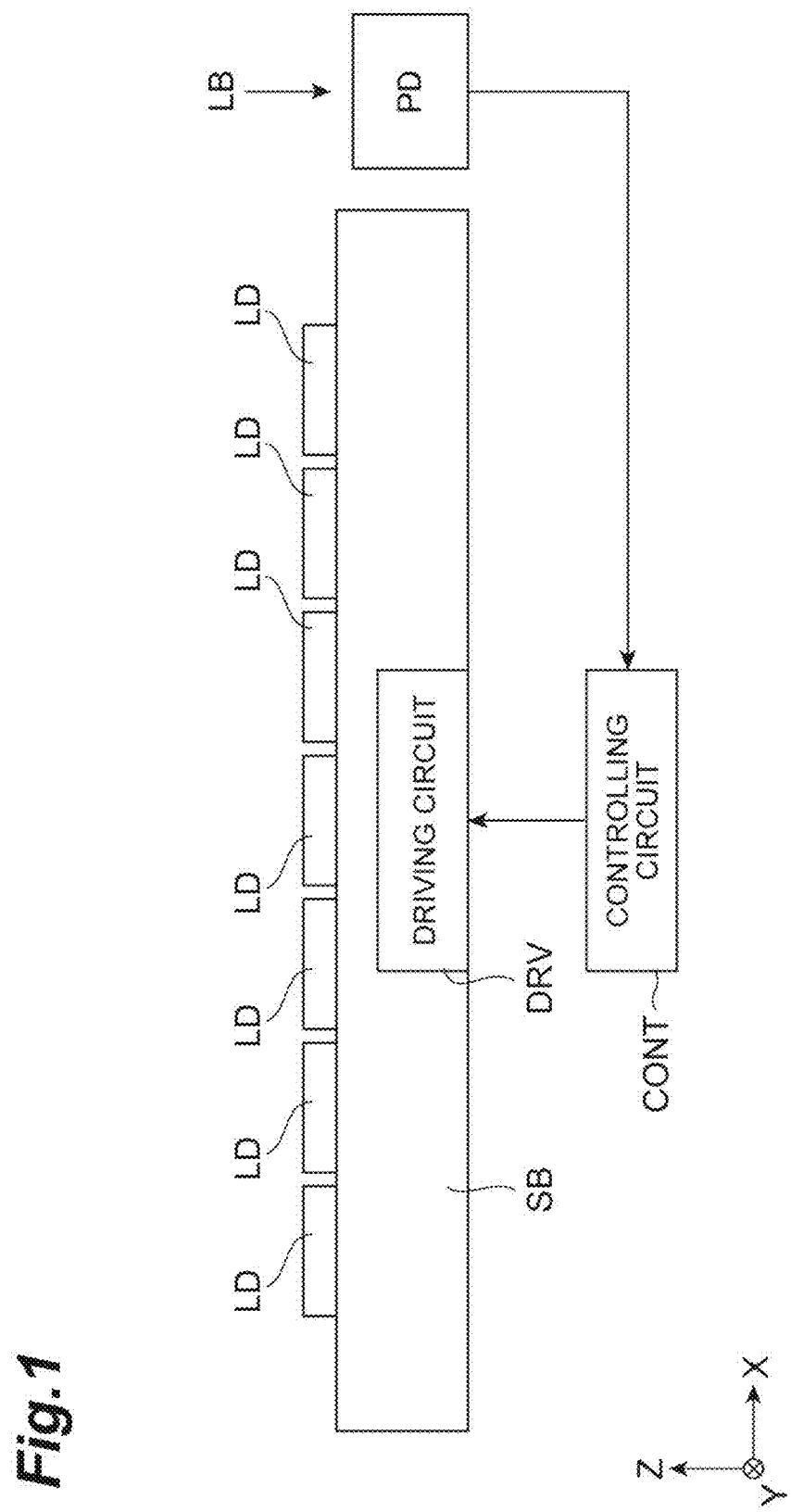
FIG. 1 is a diagram illustrating a configuration of a laser device.

Hereinafter, a laser element (semiconductor light emitting element) and a laser device according to embodiments will be described. Like reference numerals are used to denote like structural elements and redundant descriptions thereof will be omitted.

FIG. 1 is a diagram illustrating a configuration of a laser device.

A plurality of laser elements LD are one-dimensionally or two-dimensionally disposed on a support board SB. Each of the laser elements LD is driven by a driving circuit DRV provided on a rear surface of the support board SB or inside the support board SB. That is, the driving circuit DRV supplies a driving current of each of the laser elements LD according to an instruction from a controlling circuit CONT. For example, the driving current is supplied to the two-dimensionally arranged laser elements LD according to a sequential order of addresses where the laser elements LD are disposed. A laser beam is emitted from the laser element LD from a direction perpendicular to the board to a direction having a specific inclination. When the laser elements LD are sequentially lighted in the order of addresses, the object is scanned by the laser beam in a pseudo manner. A laser beam LB reflected by the target object can be detected by a photodetector PD, such as a photodiode.

A detection signal indicating laser beam intensity, which is detected by the photodetector PD, is input to the controlling circuit CONT. When the laser elements LD are pulse-driven, the photodetector PD can measure a time from an emission timing to a detection timing of the laser beam, that is, measure a distance to the target object.

The laser device can be used for, for example, the following use. For example, the laser device can be used to emit the laser beam to the target object and measure a distance to a laser beam irradiation position, thereby measuring a three-dimensional shape of the target object. When three-dimensional shape data is used, various machining devices or medical devices can use the three-dimensional shape data. In addition, when the laser beam is output to a moving object such as a vehicle, it is possible to measure a distance according to a direction toward an obstacle, and use a brake or a handle as a safety apparatus that performs automatic control or assist control, according to the distance.

A detailed structure of a semiconductor laser element to be used in the aforementioned laser device will be described below. The laser element can emit laser light having various intensity patterns.

Figure 2:
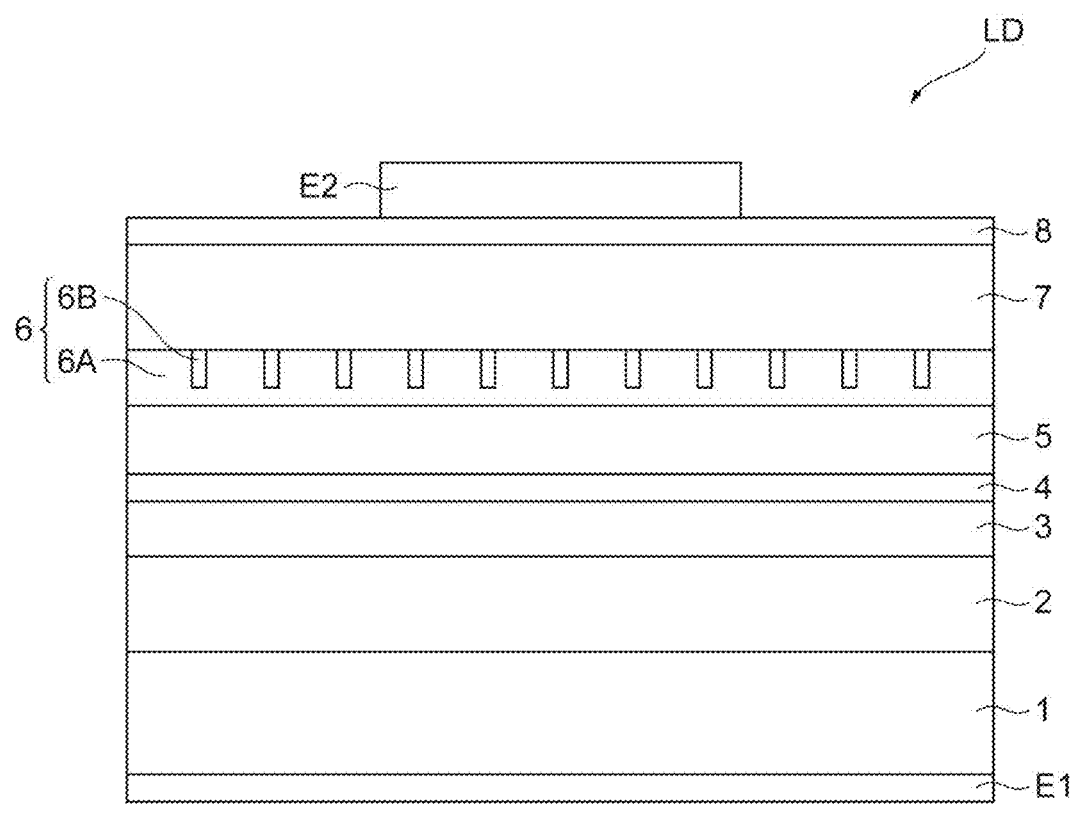
FIG. 2 is a diagram illustrating a configuration of a laser element.

FIG. 2 is a diagram illustrating a configuration of a laser element.

The laser element LD selects laser light from an active layer 4 and outputs the selected laser light to the outside. As the structure of the laser element, as in the past, the laser light may be incident into a phase modulation layer 6 through an optical fiber or directly, from a laser element body, such as a semiconductor laser element. The laser light which is incident into the phase modulation layer 6 forms a predetermined mode according to a lattice of the phase modulation layer 6 within the phase modulation layer 6 and emits a laser beam having a desired pattern to the outside in a direction perpendicular to a surface of the phase modulation layer 6.

The laser element LD is a laser light source that forms a standing wave in an XY in-plane direction and outputs a plane wave, a phase of which is controlled in a Z direction, and includes an active layer 4 that generates laser light, an upper cladding layer 7 and a lower cladding layer 2 between which the active layer 4 is interposed, and light guide layers 3 and 5 which are disposed between the upper cladding layer 7 and the lower cladding layer 2 and between which the active layer 4 is interposed. The phase modulation layer 6 is disposed between the upper cladding layer 7 and the active layer 4. In the structure illustrated in FIG. 2, a second electrode E2 is provided in a central region of a contact layer 8.

In this structure, on a semiconductor substrate 1, the lower cladding layer 2, the lower light guide layer 3, the active layer 4, the upper light guide layer 5, the phase modulation layer 6, the upper cladding layer 7, and the contact layer 8 are sequentially laminated. A first electrode E1 is provided on a lower surface of the semiconductor substrate 1, and a second electrode E2 is provided on an upper surface of the contact layer 8. When a driving current is supplied between the first electrode E1 and the second electrode E2, recombination of electrons and holes occur inside the active layer 4, and therefore, the active layer 4 emits light. A carrier to contribute to light emission and generated light are effectively trapped by the upper and lower light guide layers 3 and 5 and the cladding layers 2 and 7 therebetween.

The laser light emitted from the active layer 4 is incident into the phase modulation layer 6 and forms a predetermined mode. In addition, the phase modulation layer 6 includes a base layer 6A formed of a first refractive index medium and a plurality of different refractive index regions 6B formed of a second refractive index medium having a refractive index different from that of the first refractive index medium and disposed inside the base layer 6A. The plurality of different refractive index regions 6B include a substantially periodic structure. The laser light incident into the phase modulation layer 6 is emitted as a laser beam to the outside perpendicularly to a substrate surface, through the upper cladding layer 7, the contact layer 8, and the upper electrode E2.

In a case where an effective refractive index of the phase modulation layer 6 is n, a wavelength $\lambda_0$ (=a×n) selected by the phase modulation layer 6 falls within an emission wavelength range of the active layer 4. The phase modulation layer (diffraction grating layer) can select the wavelength $\lambda_0$ from the emission wavelengths of the active layer and output the selected wavelength $\lambda_0$ to the outside.

Figure 22:
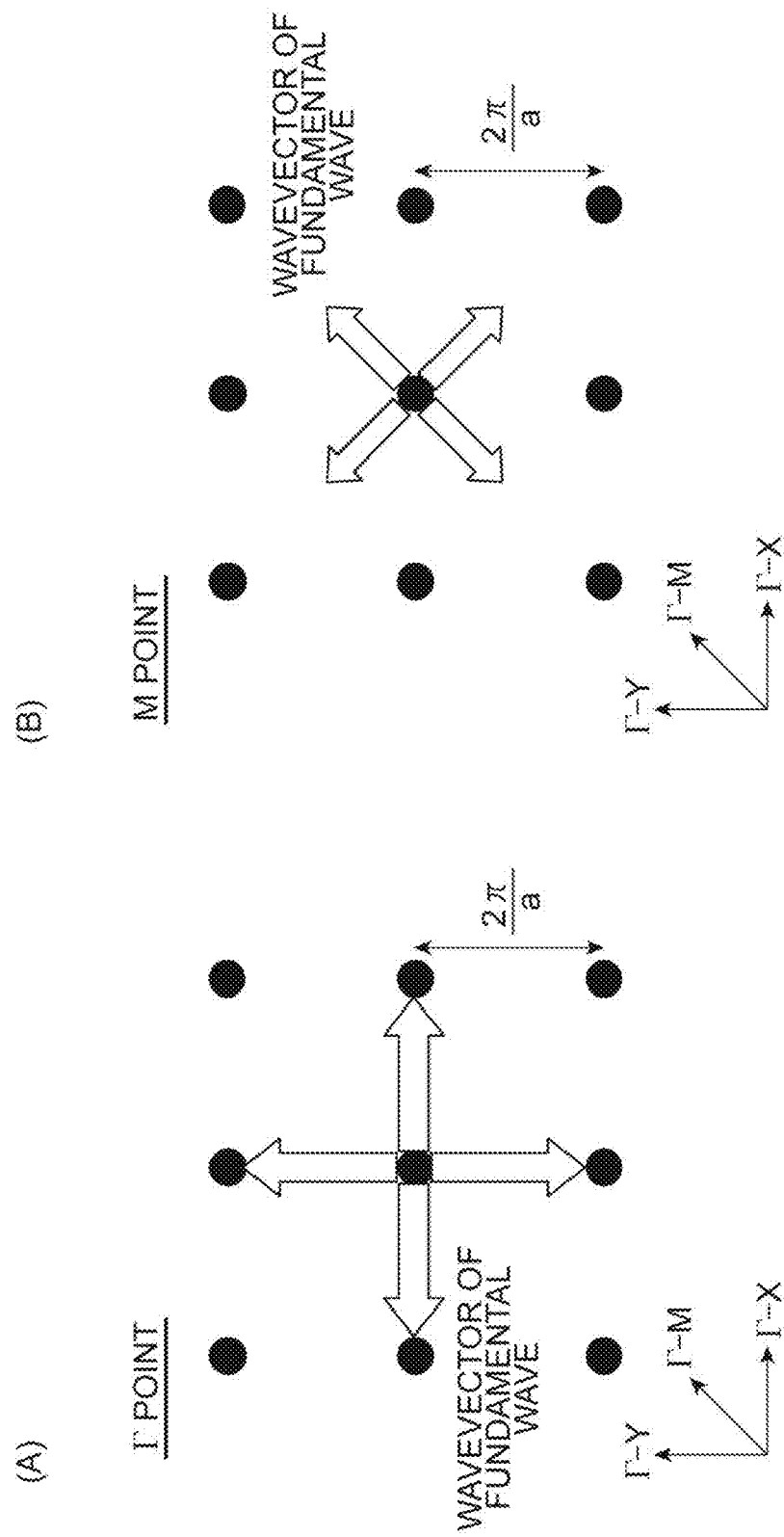
FIG. 22-(A) is a diagram illustrating a wavevector at the time of Γ point oscillation in the phase modulation layer, and FIG. 22-(B) is a diagram illustrating a wavevector at the time of M point oscillation in the phase modulation layer.

When the perturbation is 0, that is, when r=0, the oscillation state at this time corresponds to the Γ point oscillation of the square lattice, as illustrated in FIG. 22-(A), and a wavevector of a fundamental wave is oriented in a lateral direction (Γ-X direction) and a longitudinal direction (Γ-Y direction) in the plane of the phase modulation layer 6, as illustrated in the same drawing. Note that the distance r is a distance between a lattice point position O of a virtual square lattice in the phase modulation layer 6 and the centroid of the hole, and r=0 indicates the case of no perturbation. When r is not zero, a part of the standing waves generated in the plane is emitted to the outside perpendicularly to the substrate surface as a laser beam having a desired pattern. Note that a reciprocal lattice vector is 2π/a times the fundamental vector.

In addition, in a case where the effective refractive index of the phase modulation layer 6 is n, a wavelength $\lambda_0$ (=√2×a×n) selected by the phase modulation layer 6 falls within an emission wavelength range of the active layer 4. $\sqrt{2}=2^{0.5}$. The phase modulation layer (diffraction grating layer) can select the wavelength $\lambda_0$ from the emission wavelengths of the active layer and output the selected wavelength $\lambda_0$ to the outside. When the perturbation is 0, that is, when r=0, the oscillation state at this time corresponds to the M point oscillation of the square lattice as illustrated in FIG. 22-(B). As illustrated in FIG. 22-(B), the vector of the fundamental wave of laser oscillation is rotated by 45 degrees as compared with the case (A). Specifically, in the oscillation mode (B), the oscillation wavelength is the same as in the case (A), and the oscillation direction in the lattice is different. In the oscillation mode (A), the standing wave in which the main light wave advances in four directions along the lattice of the square lattice is formed, but in the oscillation mode (B), the main light wave travels in a direction rotated by 45 degrees, that is, in a diagonal direction.

FIG. 3 is a table showing a relationship between a material, a conductivity type, and a thickness (nm) of each compound semiconductor layer constituting the laser element.

The materials of each element are as illustrated in FIG. 3. The semiconductor substrate 1 is made of GaAs and the lower cladding layer 2 is made of AlGaAs. The lower light guide layer 3 is made of AlGaAs, the active layer 4 is made of a multiple quantum well structure MQW (barrier layer: AlGaAs/well layer: InGaAs), and the upper light guide layer 5 is made of a lower layer AlGaAs/an upper layer GaAs. In the phase modulation layer (refractive index modulation layer) 6, the base layer 6A is made of GaAs, and the different refractive index region 6B (buried layer) which is buried in the base layer 6A is made of AlGaAs, the upper cladding layer 7 is made of AlGaAs, and the contact layer 8 is made of GaAs.

Note that, as illustrated in FIG. 3, each of the layers is doped with a first conductivity type (N-type) impurity or a second conductivity type (P-type) impurity (impurity concentration is $1\times10^{17}$ to $1\times10^{21}/cm^3$), and a region which is not doped with any impurity intentionally is intrinsic (I-type). The concentration of the I-type impurity is $1\times10^{15}/cm^3$ or less.

Moreover, an energy band gap of the cladding layer is larger than an energy band gap of the light guide layer, and the energy band gap of the light guide layer is set to be larger than an energy band gap of a well layer of the active layer 4. In AlGaAs, by changing a composition ratio of Al, it is possible to easily change the energy band gap and refractive index. In $Al_XGa_{1-X}As$, when a composition ratio X of Al having a relatively small atomic radius is reduced (increased), the energy band gap having a positive correlation with the Al decreases (increases). When InGaAs is formed by mixing In having a large atomic radius with GaAs, the energy band gap decreases. That is, the Al composition ratio of the cladding layer is larger than the Al composition ratio of the light guide layer, and the Al composition ratio of the light guide layer is equal to or larger than the Al composition of the barrier layer (AlGaAs) of the active layer. The Al composition ratio of the cladding layer is set to 0.2 to 0.4, and in this example, 0.3. The Al composition ratio of the barrier layer in the light guide layer and the active layer is set to 0.1 to 0.15, and in this example, 0.1.

Also, the thicknesses of the layers are as illustrated in FIG. 3, in which a numerical range represents preferable values, and the numbers in parentheses indicate the optimum values. The phase of the laser light emitted as the plane wave in the Z direction from the phase modulation layer is also dependent on the characteristics of the phase modulation layer and therefore functions as a phase modulation layer.

Figure 9:
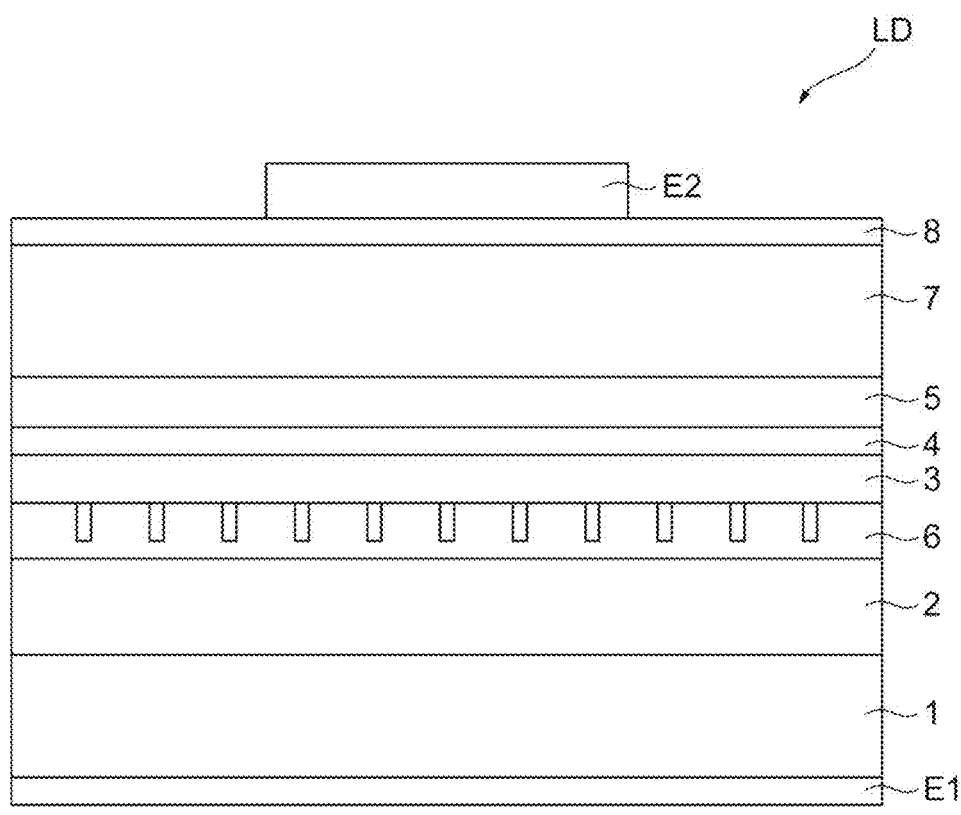
FIG. 9 is a diagram illustrating a configuration of a laser element.

As illustrated in FIG. 9, the phase modulation layer 6 may be provided between the lower cladding layer 2 and the active layer 4. In this case, the phase modulation layer 6 can be disposed at a position interposed between the lower cladding layer 2 and the light guide layer 3. This structure also achieves the same effect as described above. That is, the laser light emitted from the active layer 4 is incident into the phase modulation layer 6 and forms a predetermined mode. The laser light incident into the phase modulation layer 6 is emitted as a laser beam in a direction perpendicular to a substrate surface, through the lower light guide layer, the active layer 4, the upper light guide layer 5, the upper cladding layer 7, the contact layer 8, and the upper electrode E2. The laser beam can also be emitted while being inclined from the direction perpendicular to the substrate surface.

Although not illustrated, the same effect can be obtained if the structure includes the phase modulation layer 6 and the active layer 4 between the upper cladding layer 7 and the lower cladding layer 2.

It is also possible to deform the shape of the electrode and emit laser light from the lower surface of the substrate. That is, when the first electrode E1 is opened in a region facing the second electrode E2 on the lower surface of the semiconductor substrate 1, the laser beam is emitted from the lower surface to the outside. In this case, the first electrode E1 provided on the lower surface of the semiconductor substrate 1 is an aperture electrode having an aperture in a central portion thereof, and an antireflection film may be provided within and around the aperture of the first electrode E1. In this case, the antireflection film is formed of a dielectric single-layer film, such as silicon nitride (SiN) or silicon dioxide ($SiO_2$), or a dielectric multilayer film. As the dielectric multilayer film, a film can be used, which generated by appropriately laminating two or more dielectric layers selected from a dielectric layer group including, for example, titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$). For example, a film having a thickness of $\lambda/4$ as an optical thickness for light with a wavelength $\lambda$ is laminated. In addition, a reflection film or an antireflection film can be formed by sputtering.

In addition, although the second electrode E2 is provided on the upper surface of the contact layer 8, a region other than the region in which the contact electrode E2 is formed is, if necessary, covered with an insulating film such as $SiO_2$ or silicon nitride, thereby protecting the surface thereof.

In the above structure, holes are periodically formed at a plurality of portions of the base layer 6A by etching, and the different refractive index regions 6B are embedded in the formed holes by a metal organic vapor phase epitaxy method, a sputtering method, or an epitaxial method. However, after the different refractive index regions 6B are embedded in the holes of the base layer 6A, different refractive index coating layers made of the same material as the different refractive index regions 6B may be deposited thereon.

Figure 4:
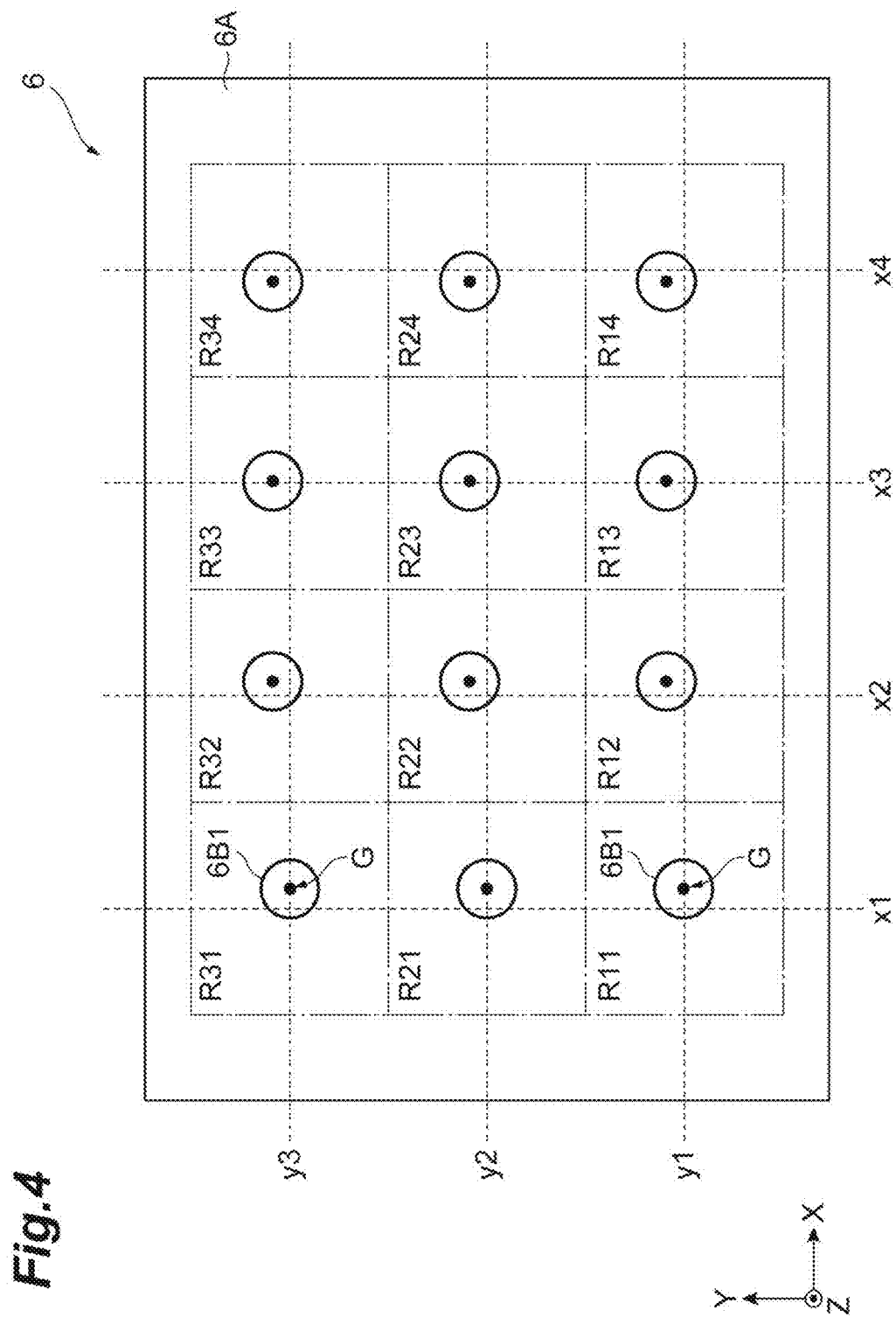
FIG. 4 is a plan view of a phase modulation layer 6.

FIG. 4 is a plan view of the phase modulation layer 6 described above.

The phase modulation layer 6 includes the base layer 6A formed of a first refractive index medium and the different refractive index region 6B formed of a second refractive index medium having a refractive index different from that of the first refractive index medium. The different refractive index region 6B is a compound semiconductor, but may be a hole filled with argon, nitrogen, or air.

In the plurality of refractive index regions 6B, only a first different refractive index region 6B1 in the hole having a first area perpendicular to a thickness direction (Z axis) (an area Si in the XY plane) is formed in unit configuration regions R11 to R34 one by one. In a case where the first different refractive index region 6131 is circular, when a diameter thereof is D, $S=\pi(D/2)^2$. A ratio of the area S of the first different refractive index region 6B1 occupied in one unit configuration region R11 to R34 is set as a filling factor (FF). The area of one unit configuration region R11 to R34 is equal to the area of the virtual square lattice in one unit lattice.

Here, the unit configuration regions R11 to R34 are defined. Each of the unit configuration regions R11 to R34 includes only one first different refractive index region 6B1. In each of the unit configuration regions R11 to R34, the (centroid G) of the first different refractive index region 6B1 is shifted from a lattice point O of a virtual square lattice closest thereto (see FIG. 5).

Figure 5:
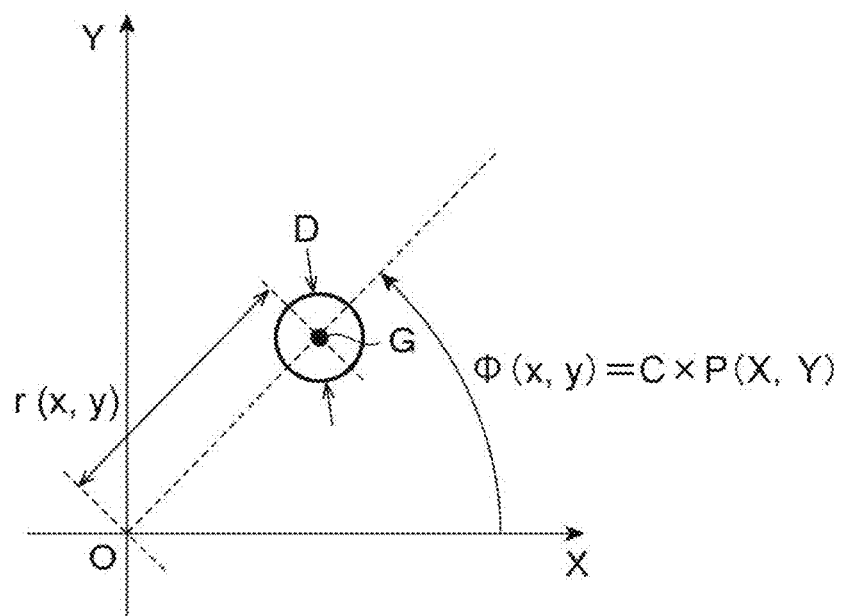
FIG. 5 is a diagram for describing a positional relationship of different refractive index regions.

Referring to FIG. 5, it is assumed that $\varphi(x, y)$ is an angle formed between a direction from the lattice point O of the virtual square lattice to the centroid G and the X axis. x is a position of an $x^{th}$ lattice point in the X axis, and y is a position of a $y^{th}$ lattice point in the Y axis. When a rotational angle $\varphi$ is identical to a positive direction of the X axis, $\varphi=0°$ is defined.

As illustrated in FIG. 4, in the phase modulation layer 6, the plurality of unit configuration regions R11 and R34 are two-dimensionally arranged in the XY plane including the X axis and the Y axis, and XY coordinates of the unit configuration regions R11 and R34 are respectively given at centroid positions of the unit configuration regions, the centroid positions coincide with the lattice point of the virtual square lattice. The XY coordinates of each of the unit configuration regions R11 to R34 are set as (X, Y).

The coordinates of the unit configuration region R11 are (x1, y1), and the coordinates of the unit configuration region Rmn are (xm, yn) (m and n are natural numbers). At this time, the rotational angle distribution $\varphi(x, y)$ has a specific value for each position determined by x (=x1, x2, x3, x4 . . . ) and y (=y1, y2, y3, y4 . . . ), but it is not necessarily expressed by a specific function. That is, as described above, the rotational angle distribution $\varphi(x, y)$ can be determined from the phase distribution extracted from a complex amplitude distribution obtained by performing Fourier transformation on the output beam pattern of the present invention. The function can also be applied to an entire region or a specific region of the phase modulation layer.

Figure 6:
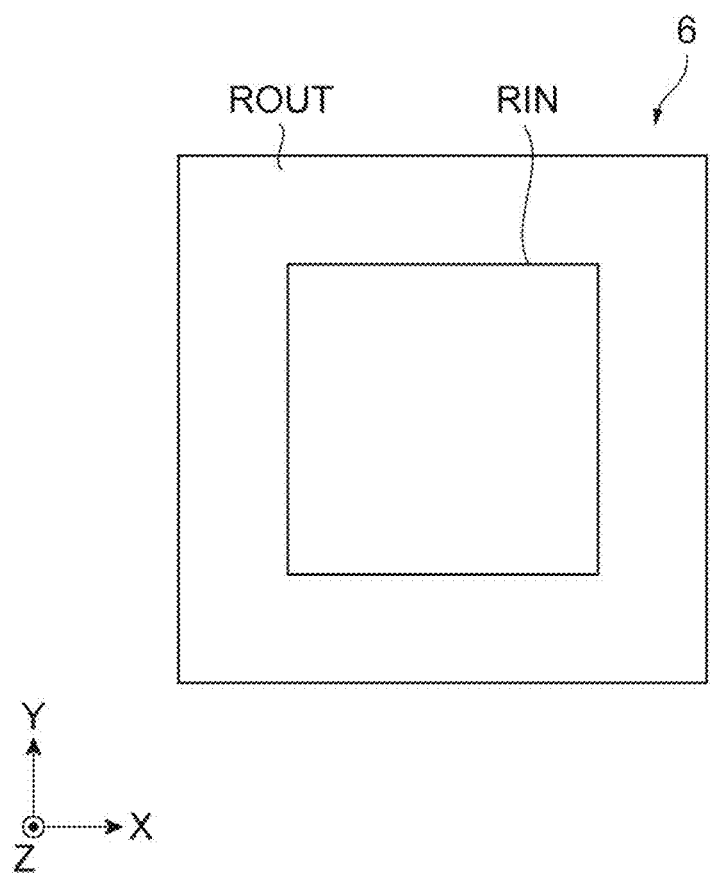
FIG. 6 is an example in which a refractive index substantially-periodic structure of FIG. 4 is applied only in a specific region of a phase modulation region.

FIG. 6 is an example in which the refractive index substantially-periodic structure of FIG. 4 is applied only in a specific region of the phase modulation region.

As illustrated in the plan view, in the inside of a square inner region MT, a substantially periodic structure (for example, the structure of FIG. 4) for emitting a target beam pattern is formed. On the other hand, a perfectly circular different refractive index region in which the centroid position coincides with the lattice point position of the square lattice is disposed in an outer region ROUT surrounding the inner region RIN. For example, a filling factor FF in the outer region ROUT is set to be 12%. Also, the lattice interval of the square lattice that is virtually set is the same (=a) in both the inner region RIN and the outside region ROUT.

In the case of this structure, since light is also distributed in the outer region ROUT, there is an advantage that can suppress generation of a high frequency noise (so-called window function noise) caused by abrupt change in light intensity in the peripheral portion of the inner region RIN.

In the present invention, a polarizing plate may not be used, and light utilization efficiency is high.

Figure 7:
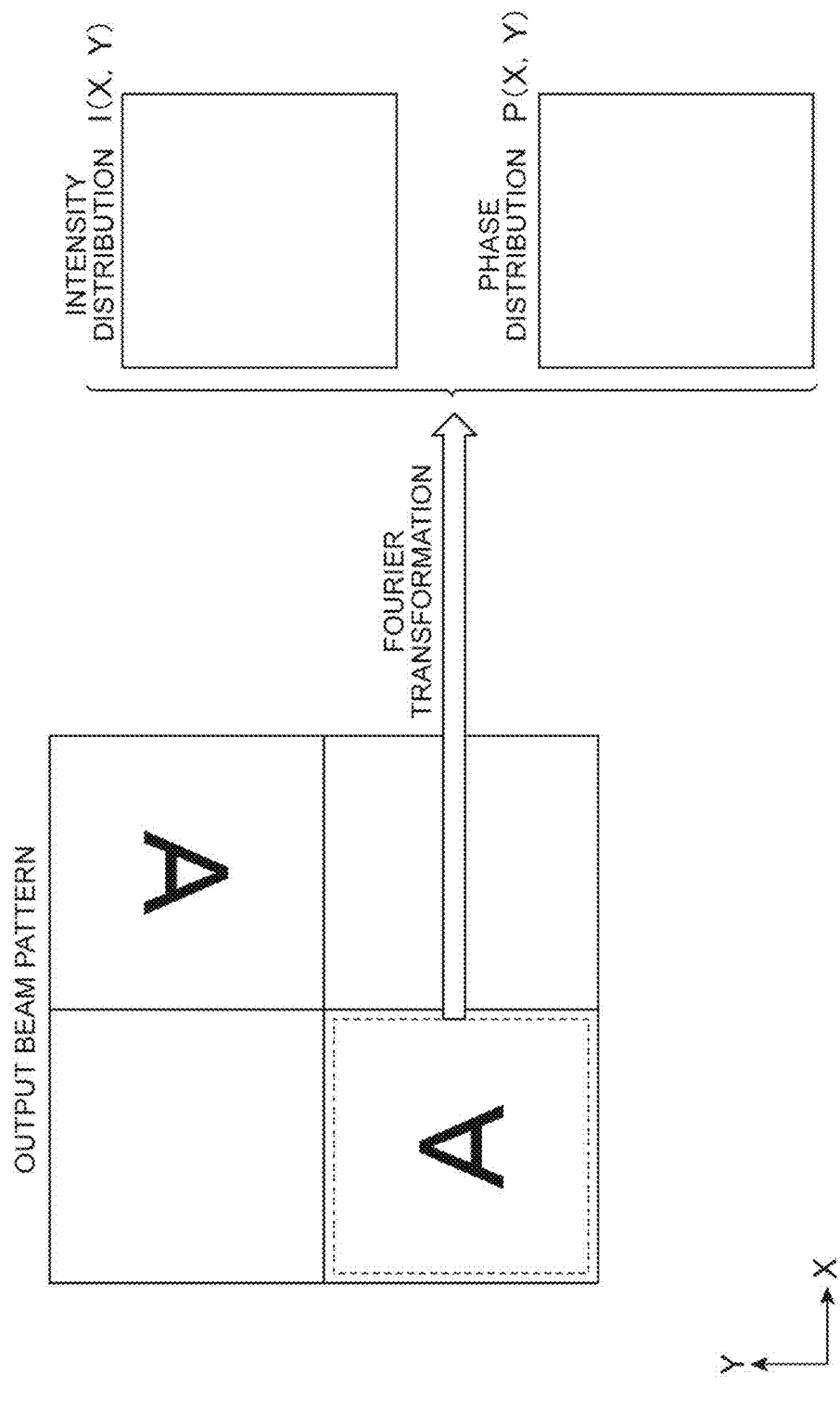
FIG. 7 is a diagram for describing a relationship between an output beam pattern and an angle $\varphi$ in the phase modulation layer 6.

FIG. 7 is a diagram for describing a relationship between the output beam pattern and the angle $\varphi$ in the phase modulation layer 6. This output beam pattern is a beam pattern observed by driving the present invention. The center of the drawing corresponds to the direction perpendicular to the substrate of the present invention and shows four quadrants with this as the origin. FIG. 7 illustrates a case where images are obtained in the first quadrant and the third quadrant as an example, but it is also possible to obtain images in the second quadrant and the fourth quadrant, or all the quadrants. At this time, a beam pattern that is point symmetrical with respect to the origin (that is, the direction perpendicular to the substrate of the device) is obtained from the present invention. Here, as an example, a case where a pattern in which the character "A" in the first quadrant is rotated by 180 degrees is obtained in the third quadrant will be described. It is apparent that the beam pattern can also be obtained in the direction perpendicular to the substrate of the present invention, and in this case, a pair of point symmetrical patterns is simultaneously observed to overlap. In particular, rotationally symmetrical beam patterns (for example, patterns such as a cross, a circle, a double circle, or the like) are overlapped and observed as one pattern. Here, for the sake of simplicity, a case where images are obtained in the first quadrant and the third quadrant will be described as an example.

In the present invention, the emitted beam pattern includes at least one: spot, straight line, cross, figure, photograph, computer graphics (CG), lattice pattern, or character. Characters configured by beam patterns are meanings of characters of countries in the world, such as alphabet, Japanese, Chinese, German, or the like. In the case of Japanese, the characters include kanji, hiragana, and katakana. For example, in the output beam pattern, it is intended to display the character "A" in the first quadrant and the third quadrant. In the first quadrant, characters in the third quadrant are inverted and displayed. In this case, in order to design the phase modulation layer, an angle $\varphi$ is obtained by using the beam pattern in the third quadrant as the original image according to the following procedure.

A complex amplitude distribution F(X, Y) obtained by performing two-dimensional Fourier transformation on a specific region (in this case, the third quadrant) of the beam pattern in the XY plane is expressed by using an intensity distribution I(X, Y) in the XY plane and a phase distribution P(X, Y) in the XY plane, with j as an imaginary unit, and the intensity distribution and the phase distribution can be obtained.

That is, F(X, Y)=I(X, Y)×exp {P(X, Y) j}.

Here, in the phase modulation layer 6, when it is assumed that $\varphi$ is an angle formed by the X axis and the direction from each lattice point of the above-described virtual square lattice to the centroid G of the corresponding different refractive index region, a constant is C, (x, y) is a position of a virtual square lattice point at an $x^{th}$ position in the X-axis direction and a $y^{th}$ position in the Y-axis direction, and $\varphi$(x, y) is an angle at the position (x, y), an angular distribution $\varphi$(x, y) can be obtained from $\varphi$(x, y)=C×P(X, Y). Here, C is a constant and has the same value for all positions (x, y).

In the case of displaying the character "A", the beam pattern may be Fourier-transformed and the centroid position G of the different refractive index region may be shifted from the lattice point position O of the virtual square lattice in the direction of the angle $\varphi$ according to the phase of the complex amplitude. An arbitrary beam pattern or a pair of oblique single peak beams can be obtained by adjusting the angle $\varphi$. A far-field image after the Fourier transformation of the laser beam can have various shapes, such as a single- or multiple-spot shape, an annular shape, a linear shape, a character shape, a double-annular shape, or a Laguerre-Gaussian beam shape.

Since the beam direction can also be controlled, laser elements can be one-dimensionally or two-dimensionally arranged and used for a laser processing machine or the like which electrically performs high-speed scanning.

In addition, as a method of obtaining the intensity distribution and the phase distribution from the complex amplitude distribution obtained by the Fourier transformation, for example, the intensity distribution I(x, y) can be calculated by using the abs function of MathWorks' numerical analysis software "MATLAB", and the phase distribution P(x, y) can be calculated by using the angle function of the MATLAB.

The characteristics of the beam pattern obtained by the present invention will be described. That is, the points to be noted when implementing the present invention of determining the angular distribution from the Fourier transformation result of the beam pattern and determining the arrangement of the holes as described above will be described. When the beam pattern before the Fourier transformation is divided into four quadrants 1, 2, 3, and 4 as illustrated in FIG. 8-(A), the beam pattern obtained from the present invention is as given as illustrated in FIG. 8-(B). That is, a pattern in which the first quadrant of FIG. 8-(A) rotated by 180 degrees and the third quadrant of FIG. 8-(A) overlap each other appears in the first quadrant of the beam pattern of the present invention, a pattern in which the second quadrant of FIG. 8-(A) rotated by 180 degrees and the fourth quadrant of FIG. 8-(A) overlap each other appears in the second quadrant of the beam pattern of the present invention, a pattern in which the third quadrant of FIG. 8-(A) rotated by 180 degrees and the first quadrant of FIG. 8-(A) overlap each other appears in the third quadrant of the beam pattern of the present invention, and a pattern in which the fourth quadrant of FIG. 8-(A) rotated by 180 degrees and the second quadrant of FIG. 8-(A) overlap each other appears in the fourth quadrant of the beam pattern of the present invention. Therefore, when a beam pattern having a value only in the first quadrant is used as the beam pattern (original pattern) before the Fourier transformation, the first quadrant of the original pattern appears in the third quadrant in the beam pattern obtained from the present invention, and only the pattern in which the first quadrant of the original pattern is rotated by 180 degrees appears in the first quadrant in the beam pattern obtained from the present invention.

Next, the amount of shifting the centroid position G of the different refractive index region from the lattice point position O of the virtual square lattice will be described. When a lattice constant defining an interval of the centroid G is set as a, a filling factor of the different refractive index region is given as $FF=S/a^2$. Here, S is the area of the different refractive index region, and for example, in the case of a perfect circle, when the diameter of the perfect circle is D, $S=\pi \times (D/2)^2$. Also, in the case of the square shape, when the length of one side of the square is L, $S=L^2$ is given. The same applies to the other shapes. Hereinafter, specific embodiments will be described. FIG. 10-(A) is an original pattern image common to all the embodiments unless otherwise explained. The character "光" (light) is configured by 704× 704 pixels. At this time, the character "光" exists in the first quadrant, and there are no patterns in the second quadrant to the fourth quadrant. FIG. 10-(B) shows the intensity distribution extracted by performing the two-dimensional. Fourier transformation on FIG. 10-(A), which is configured by 704×704 elements. FIG. 10-(C) shows the phase distribution extracted by performing the two-dimensional Fourier transformation on FIG. 10-(A), which is configured by 704×704 elements. This also corresponds to the angular distribution at the same time, and FIG. 10-(C) shows the distribution of angles of 0 to $2\pi$ according to the shade of color. The part with black color represents an angle of 0.

FIG. 11-(A) is a partially extracted top view of the different refractive index region in the first embodiment, and the different refractive index region in the base layer is shown white. In practice, 704×704 different refractive index regions exist. The planar shape of the different refractive index region is a perfect circle, the hole diameter is D=111 nm, the distance r between the lattice point position O of the virtual square lattice and the centroid of the hole is r=8.52 nm, and the lattice constant of the virtual square lattice is a=284 nm. At this time, the filling factor FF of the perfect circle is FF=12%, and r=0.03a. FIG. 11-(B) is a predicted beam pattern obtained by performing the Fourier transformation on the entire different refractive index region.

Figure 12:
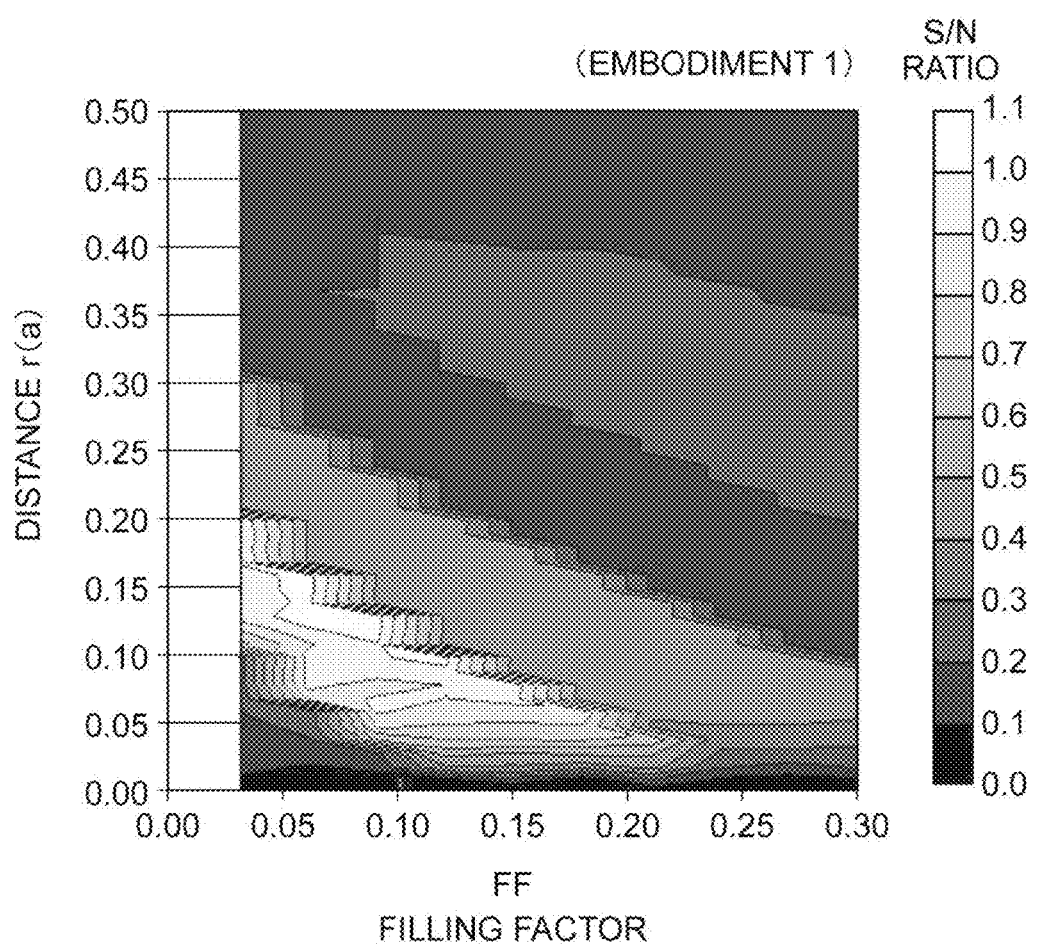
FIG. 12 is a graph showing an S/N ratio of an output beam pattern according to a relationship between a filling factor FF and a distance r(a).

FIG. 12 is a graph showing the S/N ratio of the output beam pattern, that is, the intensity ratio of the desired beam pattern to noise, according to the relationship between the filling factor FF and the distance r(a) in the first embodiment. In addition, HG 17 is a graph showing a relationship between the distance r(a) and the S/N ratio in the case of FIG. 12.

In the case of this structure, when at least the distance r is 0.3a or less, the S/N ratio is higher than that when exceeding 0.3a. When the distance r is 0.01a or more, the S/N ratio is higher than that when the distance r is 0. In particular, referring to FIG. 17, a peak of the S/N ratio exists within these numerical ranges. That is, from the viewpoint of improving the S/N ratio, the distance r is preferably 0<r≤0.3a, more preferably 0.01a≤r≤0.3a, and further preferably 0.03a≤r≤0.25. However, even when r is smaller than 0.01a, a beam pattern can be obtained although the S/N ratio is small.

FIG. 13-(A) is a partially extracted top view of the different refractive index region in the second embodiment, and the different refractive index region in the base layer is shown white. In practice, 704×704 different refractive index regions exist. The planar shape of the different refractive index region is a square, the length L of one side is L=98.4 nm, the distance r between the lattice point position O of the virtual square lattice and the centroid of the hole is r=8.52 nm, and the lattice constant of the virtual square lattice is a=284 nm. At this time, the filling factor FF of the square is FF=12%, and r=0.03a. FIG. 13-(B) is a predicted beam pattern obtained by performing the Fourier transformation on the entire different refractive index region.

Figure 14:
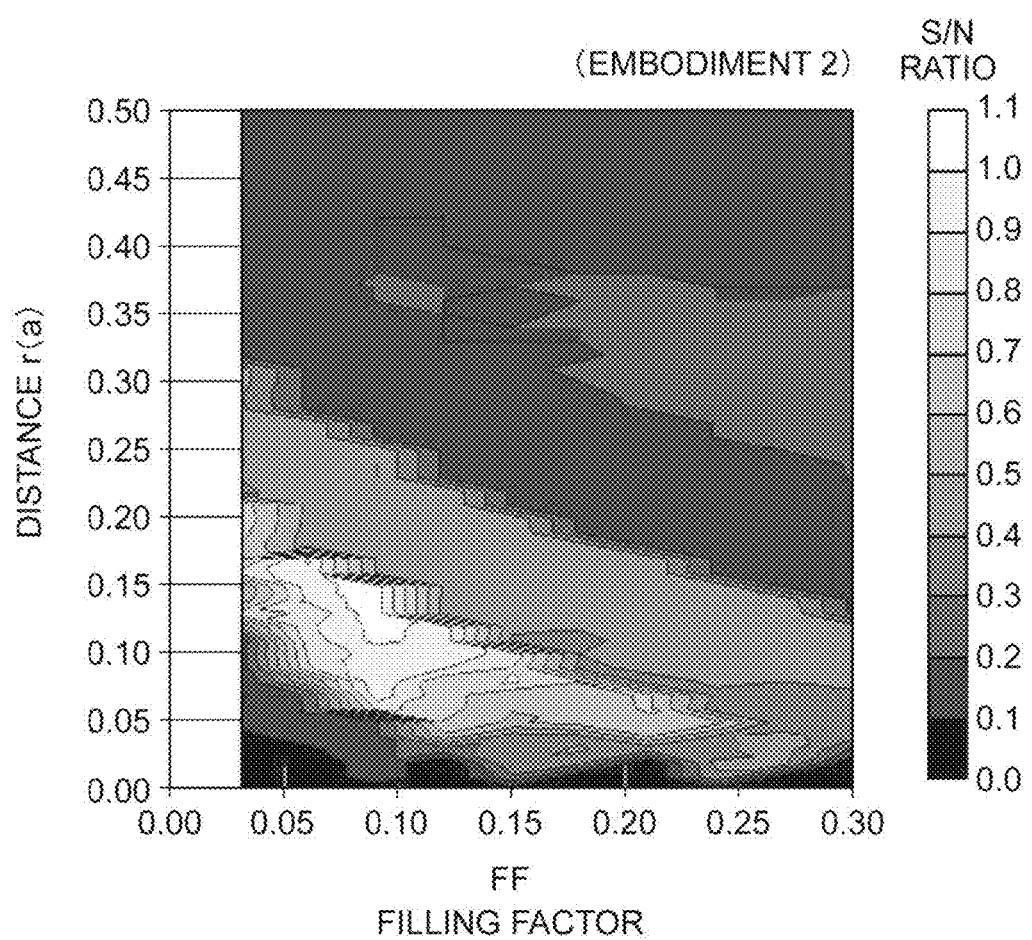
FIG. 14 is a graph showing an S/N ratio of an output beam pattern according to a relationship between a filling factor FF and a distance r(a).
Figure 18:
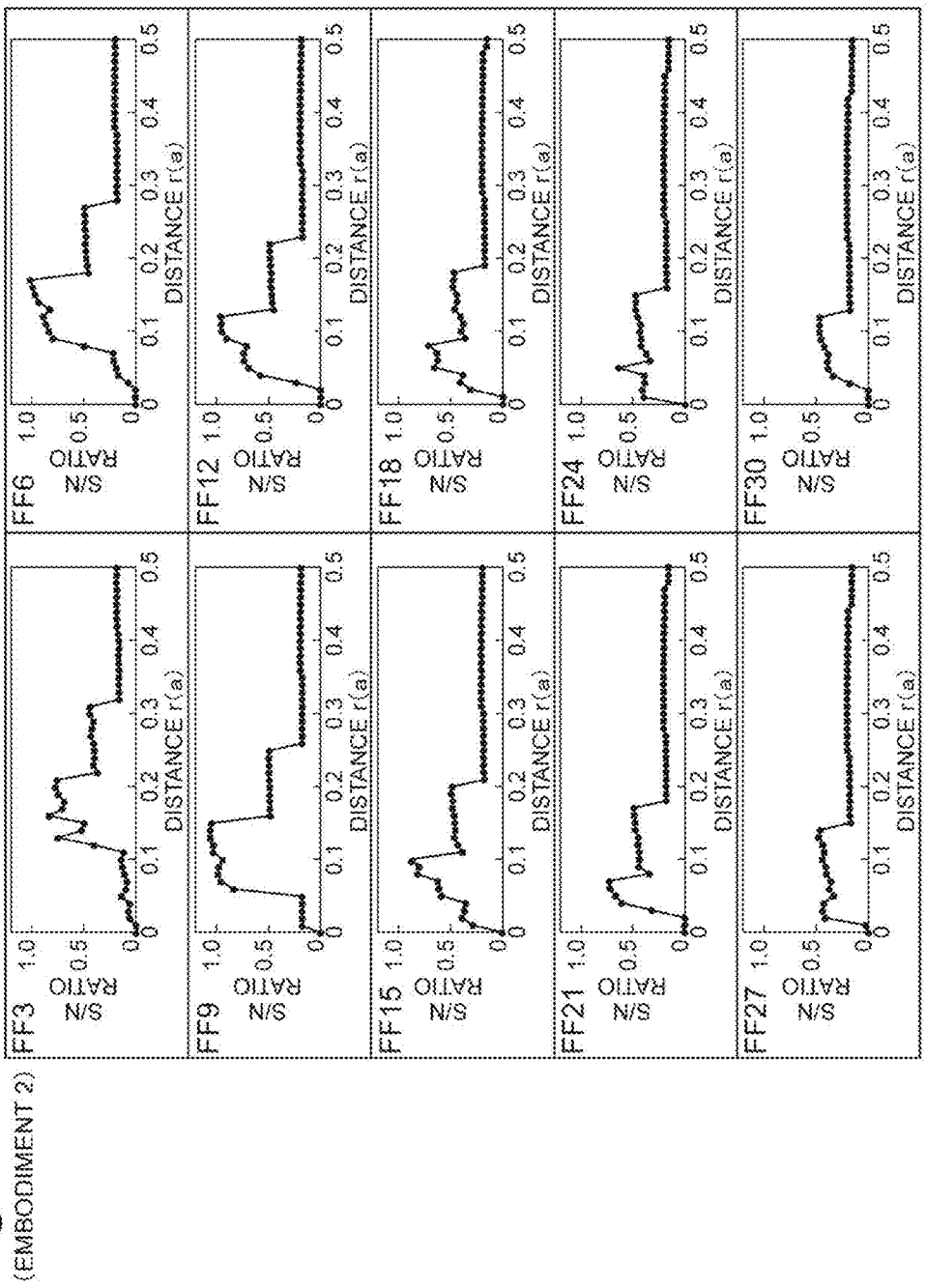
FIG. 18 is a graph showing a relationship between the distance r(a) and the S/N ratio in the case of FIG. 14.

FIG. 14 is a graph showing the S/N ratio of the output beam pattern, that is, the intensity ratio of the desired beam pattern to noise, according to the relationship between the filling factor FF and the distance r(a) in the second embodiment. In addition, FIG. 18 is a graph showing a relationship between the distance r(a) and the S/N ratio in the case of FIG. 14.

Even in the case of this structure, when at least the distance r is 0.3a or less, the S/N ratio is higher than that when exceeding 0.3a. When the distance r is 0.01a or more, the S/N ratio is higher than that when the distance r is 0. In particular, referring to FIG. 18, a peak of the S/N ratio exists within these numerical ranges. That is, from the viewpoint of improving the S/N ratio, the distance r is preferably 0<r≤0.3a, more preferably 0.01a≤r≤0.3a, and further preferably 0.03a≤r≤0.25a. However, even when r is smaller than 0.01a, a beam pattern can be obtained although the S/N ratio is small.

FIG. 15-(A) is a partially extracted top view or the different refractive index region in the third embodiment, and the different refractive index region in the base layer is shown white. In practice, 704×704 different refractive index regions exist. The planar shape of the different refractive index region is a shape in which two perfect circles overlap each other, the diameters of the holes are all D=111 nm, the first hole has the centroid at the lattice point position O of the virtual square lattice, and the second hole is located at a distance r=14.20 nm between the centroid of the hole and the lattice point position O of the virtual square lattice. At this time, the lattice constant a of the virtual square lattice was set to 284 nm. At this time, the filling factor FF of the perfect circle is FF=12%, and r=0.05a. FIG. 13-(B) is a predicted beam pattern obtained by performing the Fourier transformation on the entire different refractive index region.

Figure 16:
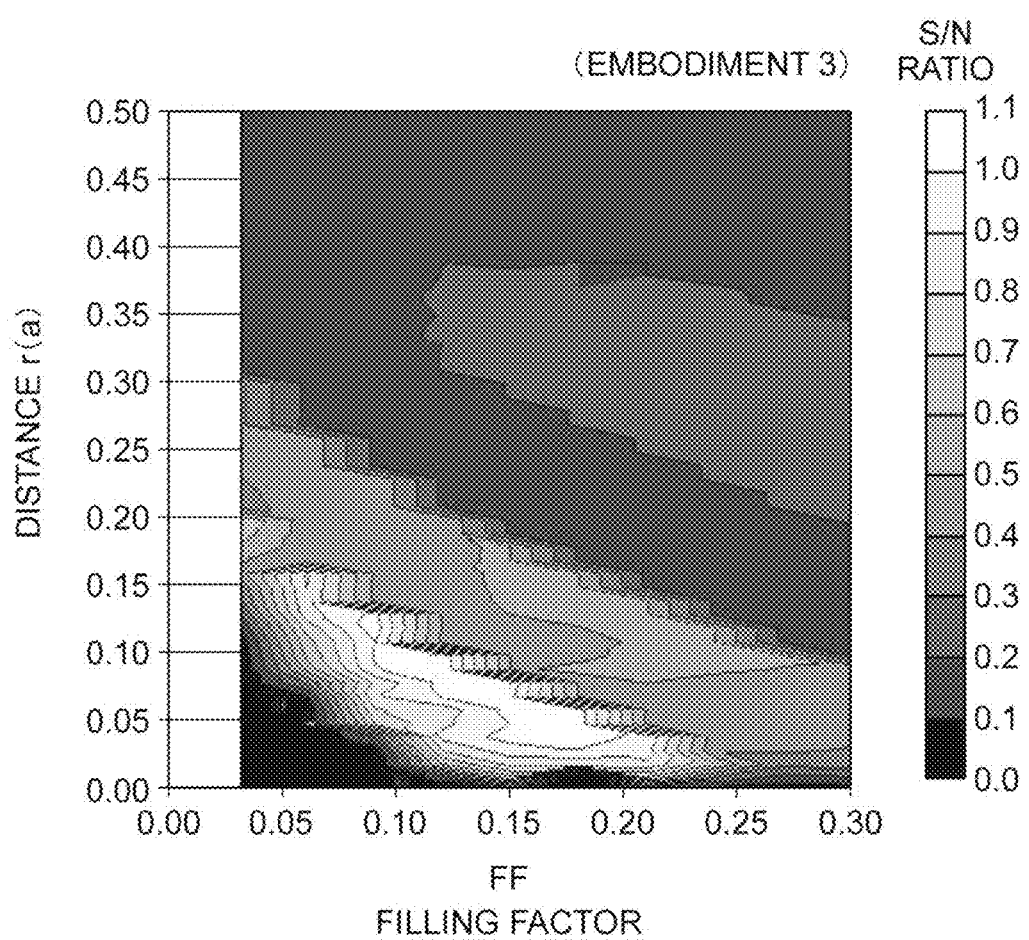
FIG. 16 is a graph showing an S/N ratio of an output beam pattern according to a relationship between a filling factor FF and a distance r(a).
Figure 19:
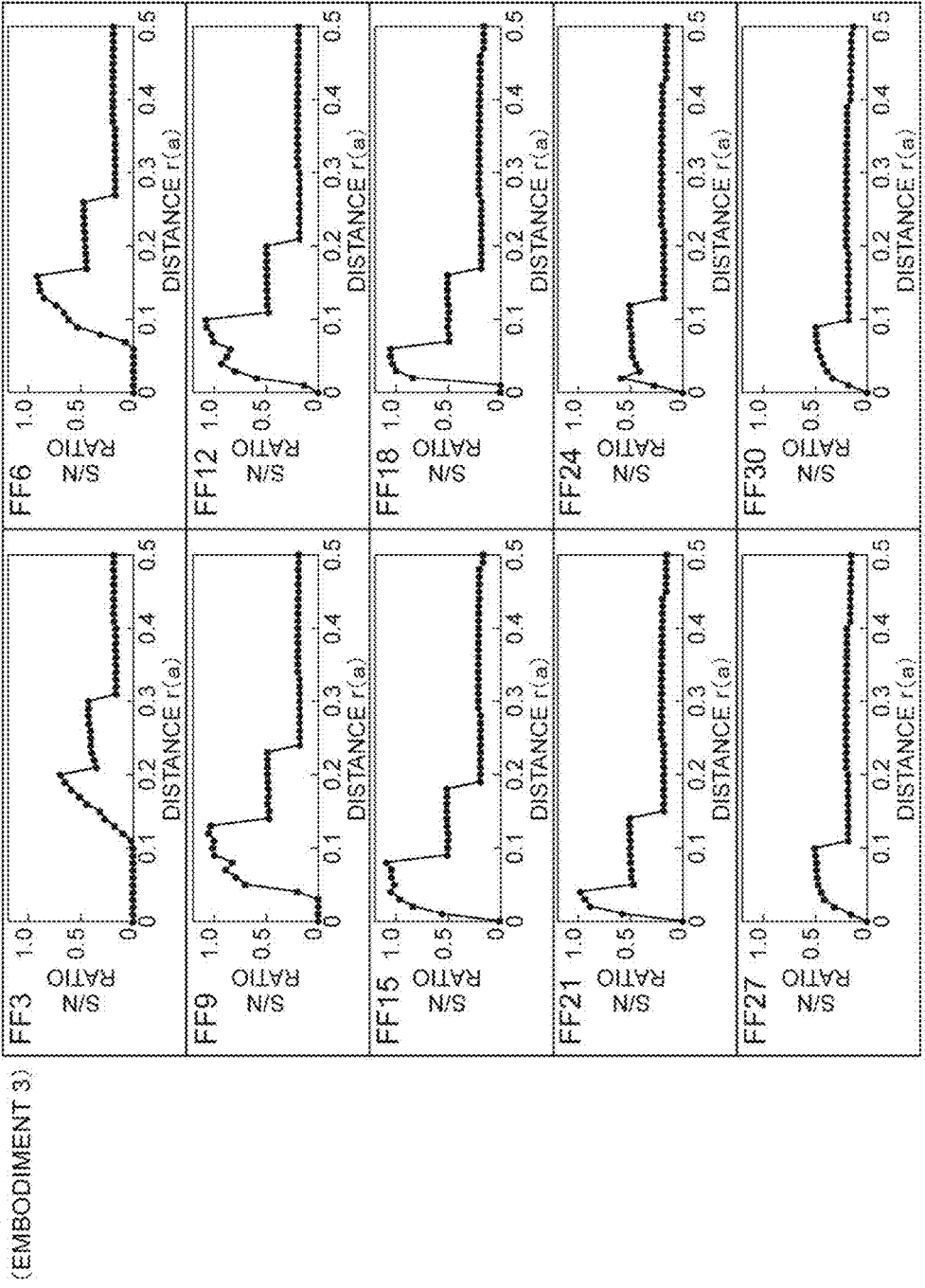
FIG. 19 is a graph showing a relationship between the distance r(a) and the S/N ratio in the case of FIG. 16.

FIG. 16 is a graph showing the S/N ratio of the output beam pattern, that is, the intensity ratio of the desired beam pattern to noise, according to the relationship between the filling factor FF and the distance r(a). FIG. 19 is a graph showing a relationship between the distance r(a) and the S/N ratio in the case of FIG. 16.

Even in the case of this structure, when at least the distance r is 0.3a or less, the S/N ratio is higher than that when exceeding 0.3a. When the distance r is 0.01a or more, the S/N ratio is higher than that when the distance r is 0. In particular, referring to FIG. 19, a peak of the S/N ratio exists within these numerical ranges. That is, from the viewpoint of improving the S/N ratio, the distance r is preferably 0<r≤0.3a, more preferably 0.01a≤r≤0.3a, and further preferably 0.03a≤r 0.25a. However, even when r is smaller than 0.01a, a beam pattern can be obtained although the S/N ratio is small.

Figure 17:
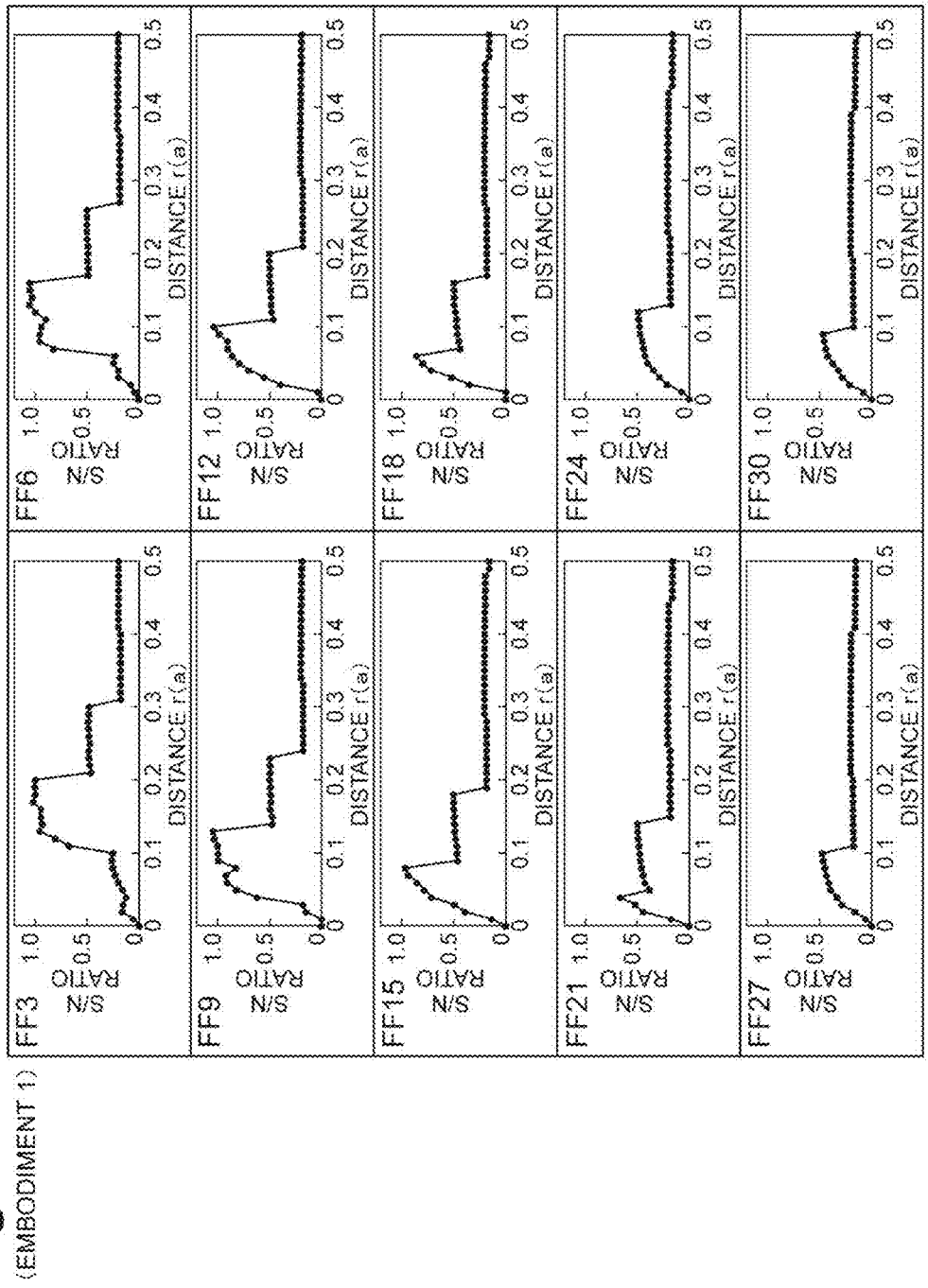
FIG. 17 is a graph showing a relationship between the distance r(a) and the S/N ratio in the case of FIG. 12.

In addition, in the case of FIGS. 12, 14, and 16, the regions where the S/N ratio exceeds 0.9, 0.6, and 0.3 are given by the following function. In FIGS. 17, 18, and 19, FF3, FF6, FF9, FF12, FF15, FF18, FF21, FF24, FF27, and FF30 respectively show FF=3%, FF=6%, FF=9% FF=12%, FF=15%, FF 18%, FF=21%, FF=24%, FF=27%, and FF=30%

(S/N in FIG. 12 is 0.9 or more)
FF>0.03,
r>0.06
r<−FF+0.23, and
r>−FF+0.13
(S/N in FIG. 12 is 0.6 or more)
FF>0.03,
r>0.03,
r<−FF+0.25, and
r>−FF+0.12
(S/N in FIG. 12 is 0.3 or more)

FF>0.03,
r>0.02,
r<−(2/3)FF+0.30, and
r>−(2/3)FF+0.083
(S/N in FIG. 14 is 0.9 or more)
r>−2FF+0.25,
r<−FF+0.25, and
r>FF−0.05
(S/N in FIG. 14 is 0.6 or more)
FF>0.03,
r>0.04,
r<−(3/4)FF+0.2375, and
r>−FF+0.15
(S/N in FIG. 14 is 0.3 or more)
FF>0.03,
r>0.01,
r<−(2/3)FF+1/3, and
r>−(2/3)FF+0.10
(S/N in FIG. 16 is 0.9 or more)
r>0.025,
r<−(4/3)FF+0.20, and
r<−(20/27)FF+0.20
(S/N in FIG. 16 is 0.6 or more)
FF>0.03,
r>0.02,
r>−(5/4)FF+0.1625, and
r<−(13/18)FF+0.222
(S/N in FIG. 16 is 0.3 or more)
FF>0.03,
r>0.01,
r<−(2/3)FF+0.30, and
r>−(10/7)FF+1/7

Among the aforementioned structures, a material system, a thickness, and a layer configuration have a degree of freedom as long as the structure includes the active layer 4 and the phase modulation layer 6. Here, a scaling law holds for a so-called square lattice photonic crystal laser when the perturbation from the virtual square lattice is 0. That is, when the wavelength becomes a constant α times, the same standing wave state can be obtained by multiplying the entire square lattice structure by α. Similarly, in the present invention, it is also possible to determine the structure of the phase modulation layer by the scaling law even at wavelengths other than those disclosed in the examples. Therefore, it is also possible to realize a semiconductor light emitting element that outputs visible light by using the active layer that emits light, such as a blue color, a green color, and a red color, and applying the scaling rule according to the wavelength. When the laser element is manufactured, each compound semiconductor layer is manufactured by metal organic chemical vapor deposition (MOCVD). Crystal growth is performed on a (001) plane of the semiconductor substrate 1, but the present invention is not limited thereto. In addition, when a laser element is manufactured by using the aforementioned AlGaN, a growth temperature of AlGaAs is in a range of 500° C. to 850° C., and upon experiment, a temperature of 550° C. to 700° C. is used. Upon growth, TMA (trimethyl aluminum) is used as an Al raw material, TMG (trimethyl gallium) and TEG (triethyl gallium) are used as a gallium raw material, $AsH_3$ (arsine) is used as an As raw material, $Si_2H_6$ (disilane) is used as a raw material for N-type impurity, and DEZn (diethyl zinc) is used as a raw material for P-type impurity. In GaAs growth, TMG and arsine are used, but TMA is not used. InGaAs is manufactured by using TMG; TMI (trimethyl indium), and arsine. Formation of an insulation film may be formed by performing sputtering on a target using its composition materials as raw materials.

That is, the aforementioned laser element is manufactured by sequentially and epitaxially growing, on an N-type semiconductor substrate (GaAs) 1, an N-type cladding layer (AlGaAs) 2, a guide layer (AlGaAs) 3, a multiple quantum well structure (InGaAs/AlGaAs) 4, a light guide layer (GaAs/AaGaAs) 5, and a base layer (GaAs) 6A such as a phase modulation layer by using MOCVD (metal organic chemical vapor deposition). Subsequently, in order to make an alignment after the epitaxial growth, an SiN layer is formed on the base layer 6A and then, a resist is formed on the SiN layer, by the PCVD (plasma CVD) method. Furthermore, the resist is exposed and developed, and the SiN layer is etched using the resist as a mask, causing the SiN layer to be partially left to form an alignment mark. Remaining resist is removed.

Next, a separate resist is coated on the base layer 6A, and a two-dimensional fine pattern is drawn on the resist using an alignment mark as a reference by an electron beam drawing device and is developed, forming the two-dimensional fine pattern on the resist. Thereafter, the two-dimensional fine pattern having a depth of about 100 nm is transferred onto the base layer 6A by dry etching using the resist as a mask to form a hole (bore) and the resist is removed. The depth of the hole is 100 nm. A compound semiconductor which becomes the different refractive index region 6B (AlGaAs) is regrown within the hole to more than the depth of the hole. An upper cladding layer (AlGaAs) 7 and a contact layer (GaAs) 8 are sequentially formed by MOCVD, and appropriate electrode material is formed on upper and lower surfaces of the substrate by a deposition method or a sputtering method, forming first and second electrodes. Also, if required, it is possible to form an insulation film on the upper and lower surfaces of the substrate by a sputtering method or the like.

When the phase modulation layer is provided under the active layer, the phase modulation layer may be formed on the lower cladding layer before the formation of the active layer and the lower light guide layer.

In the case of manufacturing a laser element body including no phase modulation layer, this manufacturing process may be omitted. Also, a columnar different refractive index region air may be made as a cavity, and air or a gas such as nitrogen or argon may be filled therein. Also, in the aforementioned virtual square lattice, an interval between vertical and horizontal lattice lines is approximately obtained by dividing a wavelength by an equivalent refractive index or dividing a wavelength by an equivalent refractive index or √2, and specifically, it is preferable to be set to about 300 nm or about 210 nm. In the case of a square lattice having a lattice interval a, when the unit vectors of orthogonal coordinates are set to x and y, fundamental translation vectors are $a_1=ax$ and $a_2=ay$, and the fundamental reciprocal lattice vectors for the translation vectors $a_1$ and $a_2$ are $b_1=(2\pi/a)y$ and $b_2=(2\pi/a)x$. In a case where a wavevector of a wave existing in a lattice is $k=nb_1+mb_2$ (n and m are arbitrary integers), a wave number k exists at a U point, but in particular, in a case where the magnitude of the wavevector is equal to the magnitude of the fundamental reciprocal lattice vector, a resonance mode (standing wave in the XY plane) in which a lattice interval is equal to a wavelength λ is obtained. In the present invention, an oscillation in such a resonance mode (standing wave state) is obtained. At this time, when considering a TE mode in which an electric field is present in a plane parallel to the square lattice, there are four modes due to the symmetry of the square lattice in the standing wave state in which the lattice interval and the wavelength are equal as described above. In the present invention, a desired beam pattern can be similarly obtained even when oscillating in any of the four standing wave states.

The standing wave in the phase modulation layer is scattered by the hole shape and the wavefront obtained in the vertical direction of the plane is phase-modulated, whereby a desired beam pattern can be obtained. Therefore, a desired beam pattern can be obtained even without a polarizing plate. This beam pattern can be not only a pair of single peak beams (spots) but also, as described above, a character shape, a group of two or more spots having the same shape, or a vector beam in which a phase or intensity distribution are spatially non-uniform.

In addition, a refractive index of the base layer 6A is in a range of 3.0 to 3.5, and a refractive index of the different refractive index region 6B is in a range of 1.0 to 3.4. In addition, an average diameter of the respective different refractive index regions 6B1 in the hole of the base layer 6A is in a range of, for example, 38 nm to 76 nm. Diffraction intensity in the Z-axis direction is changed by a change in the size of the hole. The diffraction efficiency is proportional to an optical coupling coefficient κ1 represented by the first order coefficient in the case of performing Fourier transformation on a hole shape. The optical coupling coefficient is described in, for example, K. Sakai et al., "Coupled-Wave Theory for Square-Lattice Photonic Crystal Lasers With TE Polarization, TREE J. Q. E. 46, 788-795 (2010)".

As described above, the semiconductor light emitting element includes an active layer, a pair of cladding layers between which the active layer is interposed, and a phase modulation layer optically coupled to the active layer, wherein the phase modulation layer includes a base layer and a plurality of different refractive index regions having different refractive indices from the base layer, and when an XYZ orthogonal coordinate system having a thickness direction of the phase modulation layer as the Z-axis direction is set and a square lattice of a virtual lattice constant a is set in an XY plane, each of the different refractive index regions is disposed so that a centroid position thereof is shifted from a lattice point position in a virtual square lattice by a distance r, and the distance r is $0 < r \leq 0.3a$.

In the case of this structure, the centroid position of the different refractive index region is shifted by the distance r within the above range, whereby the phase difference of the beam changes according to the direction of the vector from the position of the lattice point toward the centroid position of the different refractive index region. That is, by just changing the centroid position, it is possible to control the phase difference of the beams emitted from the different refractive index regions, and the beam pattern formed as a whole can be formed to have a desired shape. In such a semiconductor light emitting element, only a single different refractive index region is present at least inside the circle having a radius of 0.62a from the lattice point of the virtual square lattice.

In addition, in the phase modulation layer, all the different refractive index regions 6B have (a) the same figure, (b) the same area, and/or (c) the same distance r in the XY plane, and (d) the plurality of different refractive index regions can be overlapped by a translating operation, or a translating operation and a rotating operation.

By providing one or more of these conditions (a) to (d), it is possible to suppress the generation of a noise in the beam pattern and zeroth order light which becomes a noise.

Figure 20:
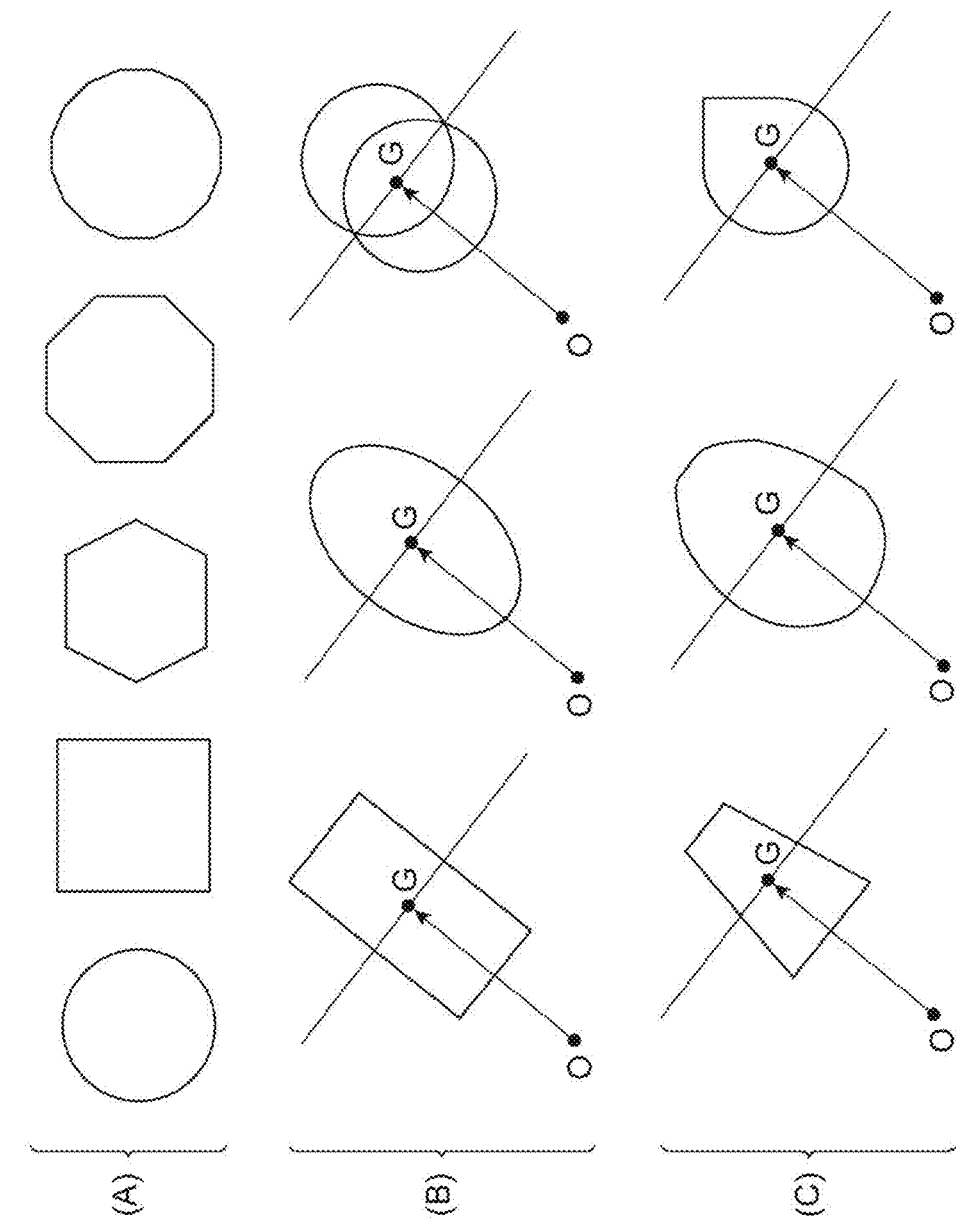
FIG. 20 is a plan view illustrating a shape of each different refractive index region 6B in an XY plane.
Figure 21:
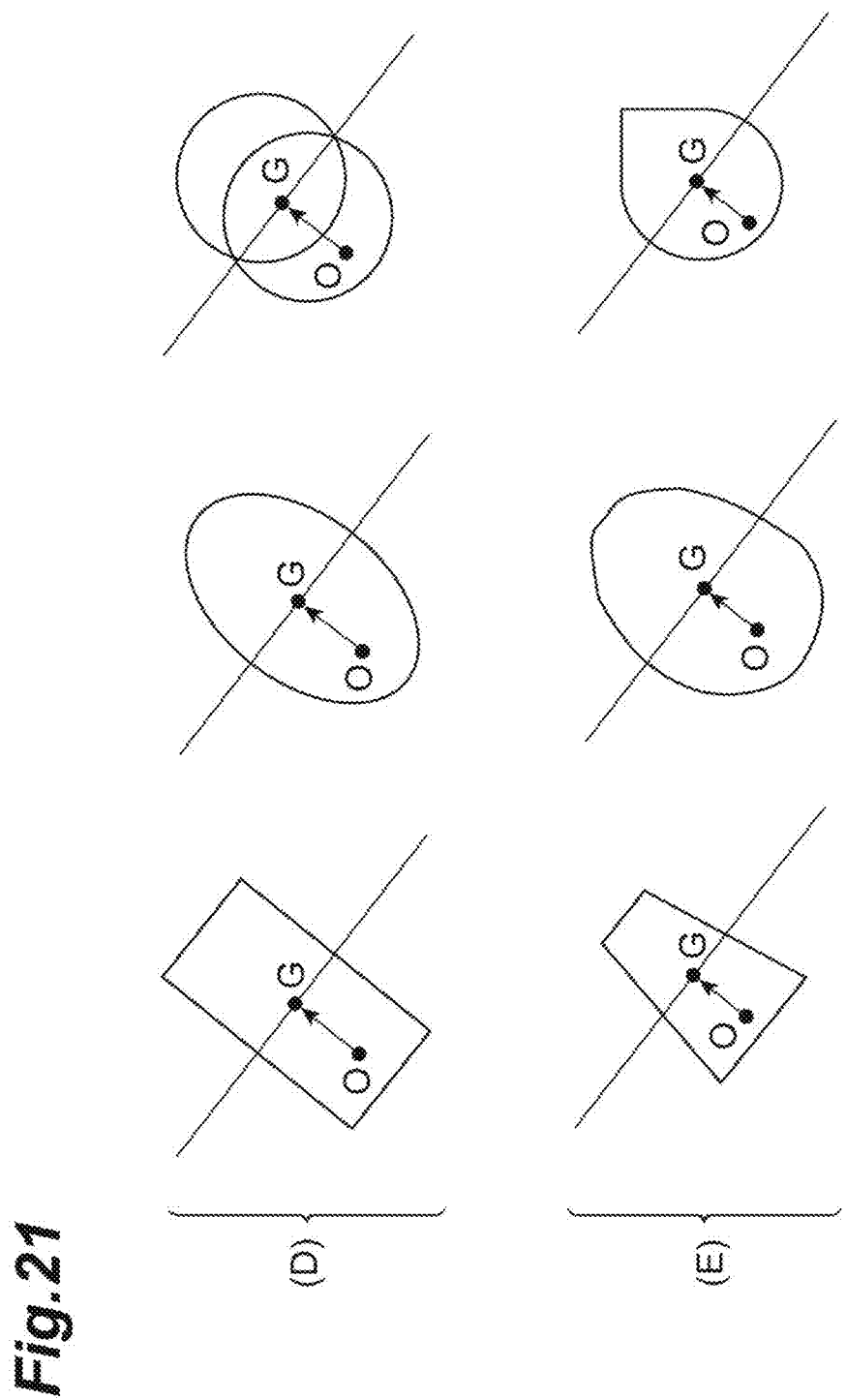
FIG. 21 is a plan view illustrating a shape of each different refractive index region 6B in an XY plane.

FIGS. 20 and 21 are plan views illustrating the shape of each different refractive index region 6B in the XY plane.

In the case of FIG. 20-(A), the shape of the different refractive index region 6B in the XY plane has a rotational symmetry. That is, the shape of each different refractive index region in the XY plane is a perfect circle, a square, a regular hexagon, a regular octagon, or a regular hexadecagon. Compared with rotationally asymmetric figures, these figures can be patterned with high accuracy because they are less affected even if the pattern is shifted in the rotating direction.

In the case of FIG. 20-(B), the shape of each different refractive index region in the XY plane has a mirror image symmetry (line symmetry). That is, the shape of each different refractive index region in the XY plane is a rectangle, an ellipse, or a shape in which a part of two circles or ellipses overlap each other. The lattice point O of the virtual square lattice is present outside these different refractive index regions.

Compared with rotationally asymmetric figures, these figures can be patterned with high accuracy because the position of the line segment serving as the line symmetric reference can be clearly known.

In the case of FIG. 20-(C), the shape of each different refractive index region in the XY plane is a trapezoidal shape, a shape (egg shape) in which a dimension in a minor axis direction in the vicinity of one end portion along a major axis of an ellipse is deformed so as to be smaller than a dimension in a minor axis direction in the vicinity of another end portion, or a shape (tear shape) in which one end portion along a major axis of an ellipse is deformed to a pointed end protruding along a major axis direction thereof. The lattice point O of the virtual square lattice is present outside these different refractive index regions. Even with such a figure, the phase of the beam can be changed by shifting the centroid position of the different refractive index region from the lattice point O of the virtual square lattice by the distance r.

In the case of FIG. 21-(D), the shape of each different refractive index region in the XY plane has a mirror image symmetry (line symmetry). That is, the shape of each different refractive index region in the XY plane is a rectangle, an ellipse, or a shape in which a part of two circles or ellipses overlap each other. The lattice point O of the virtual square lattice is present inside these different refractive index regions.

Compared with rotationally asymmetric figures, these figures can be patterned with high accuracy because the position of the line segment serving as the line symmetric reference can be clearly known. In addition, since the distance r between the lattice point O of the virtual square lattice and the centroid position of the different refractive index region is small, it is possible to reduce the occurrence of a noise in the beam pattern.

In the case of FIG. 21-(E), the shape of each different refractive index region in the XY plane is a trapezoidal shape, a shape (oval shape) in which a dimension in a minor axis direction in the vicinity of one end portion along a major axis of an ellipse is deformed so as to be smaller than a dimension in a minor axis direction in the vicinity of another end portion, or a shape (tear shape) in which one end portion along a major axis of an ellipse is deformed to a pointed end protruding along a major axis direction thereof. The lattice point O of the virtual square lattice is present inside these different refractive index regions. Even with such a figure, the phase of the beam can be changed by shifting the centroid position of the different refractive index region from the lattice point O of the virtual square lattice by the distance r. In addition, since the distance r between the lattice point O of the virtual square lattice and the centroid position of the different refractive index region is small, it is possible to reduce the occurrence of a noise in the beam pattern.

Figure 23:
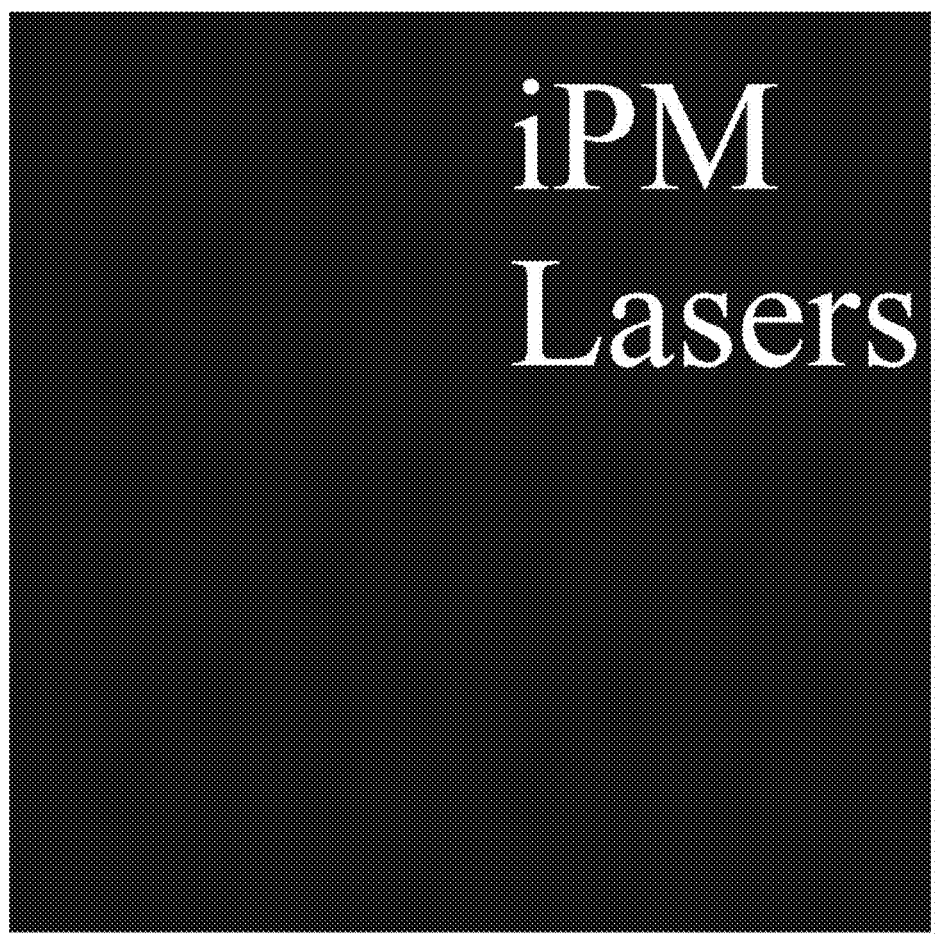
FIG. 23 is a diagram illustrating a target pattern.

FIG. 23 is an image of a target pattern and illustrates the character "iPM Lasers". At this time, the character "iPM Lasers" exists in the first quadrant, and there are no patterns in the second quadrant to the fourth quadrant.

Figure 24:
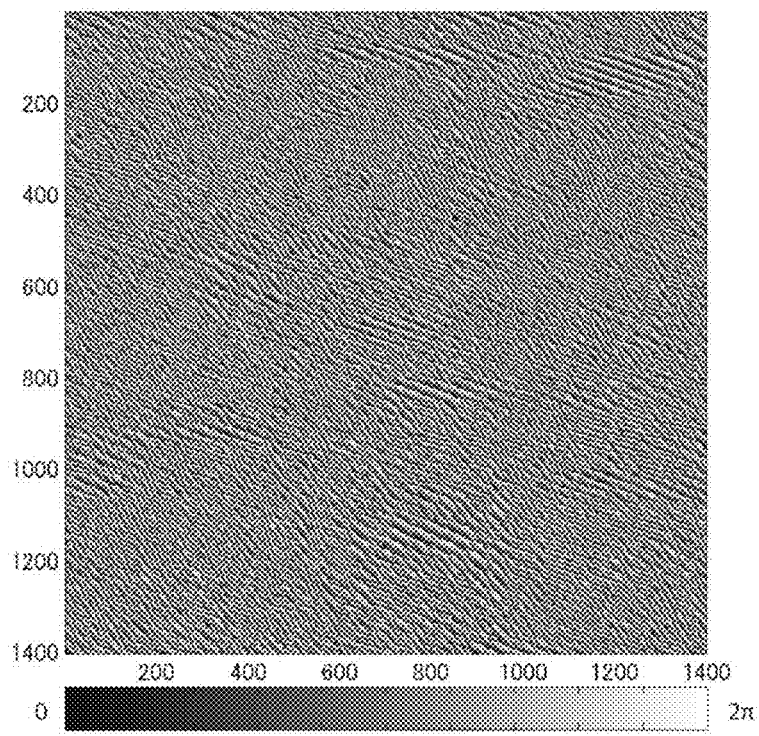
FIG. 24 is a diagram illustrating a phase distribution pattern of a phase modulation layer corresponding to FIG. 23.

FIG. 24 is a diagram illustrating a phase distribution pattern obtained by extracting a phase distribution by two-dimensional Fourier transformation of the image of FIG. 23. FIG. 24 illustrates the distribution of phases of 0 to $2\pi$ according to the shade of color. The part with black color represents a phase of 0. In the present invention, the rotational angle Φ of the hole is determined according to this phase as illustrated in FIG. 5.

Figure 25:
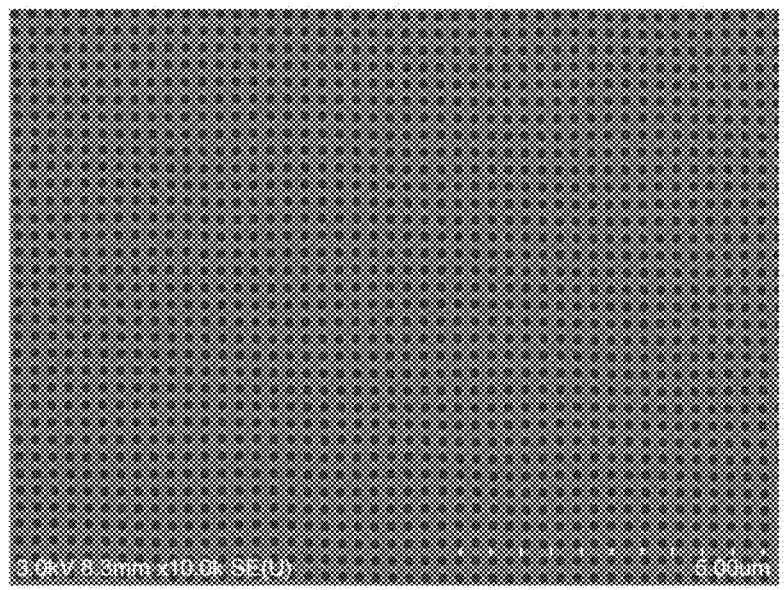
FIG. 25 is an electron microscope photograph of a hole shape of a phase modulation layer corresponding to FIG. 23.

FIG. 25 is an electron microscope photograph showing the hole shape of the phase modulation layer for obtaining the image of FIG. 23. 1400×1400 holes are disposed in the lattice points of the substantially square lattice in the phase modulation layer, and with respect to the lattice interval (=a) of the square lattice which is virtually set, the distance between the lattice point position and the centroid of the hole is r=0.06a, and the filling factor is FF=20%. In FIG. 25, not all but some of the 1400×1400 holes are shown.

Figure 26:
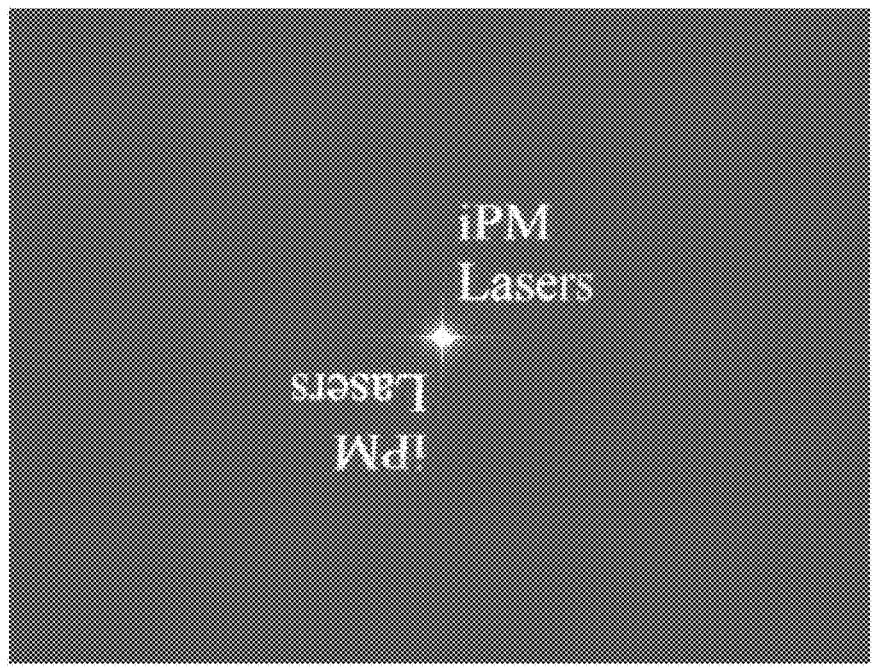
FIG. 26 is a photograph showing a beam pattern of a laser element corresponding to FIG. 23.

FIG. 26 is a photograph showing a beam pattern of a laser element corresponding to FIG. 23.

In this example, the dimension of the second electrode E2 on the p side in the laser element was set to 400 μm×400 μm, and a pulse current of 10 kHz, 50 ns, and 4 A was supplied to the laser element LD of FIG. 2 to drive the laser element. The character "iPM Lasers" and a character obtained by rotating this character by 180° appear in the first quadrant and the third quadrant.

Figure 27:
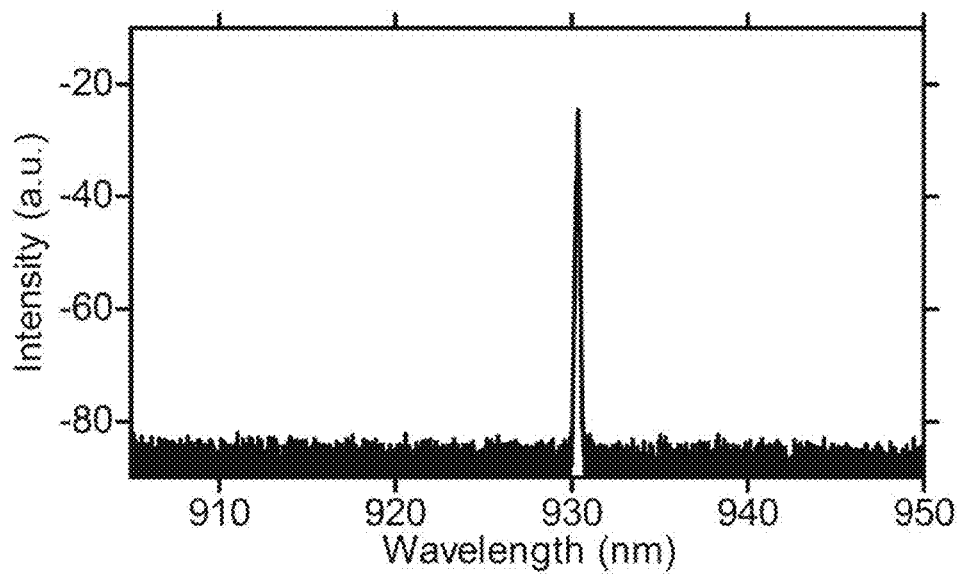
FIG. 27 is a graph showing a relationship between a wavelength and light intensity of a beam pattern of a laser element corresponding to FIG. 26.

FIG. 27 is a photograph showing a relationship between a wavelength and light intensity of a beam pattern of a laser element corresponding to FIG. 26.

An intensity peak of the laser light appears at a position exceeding a wavelength of 930 nm.

Figure 28:
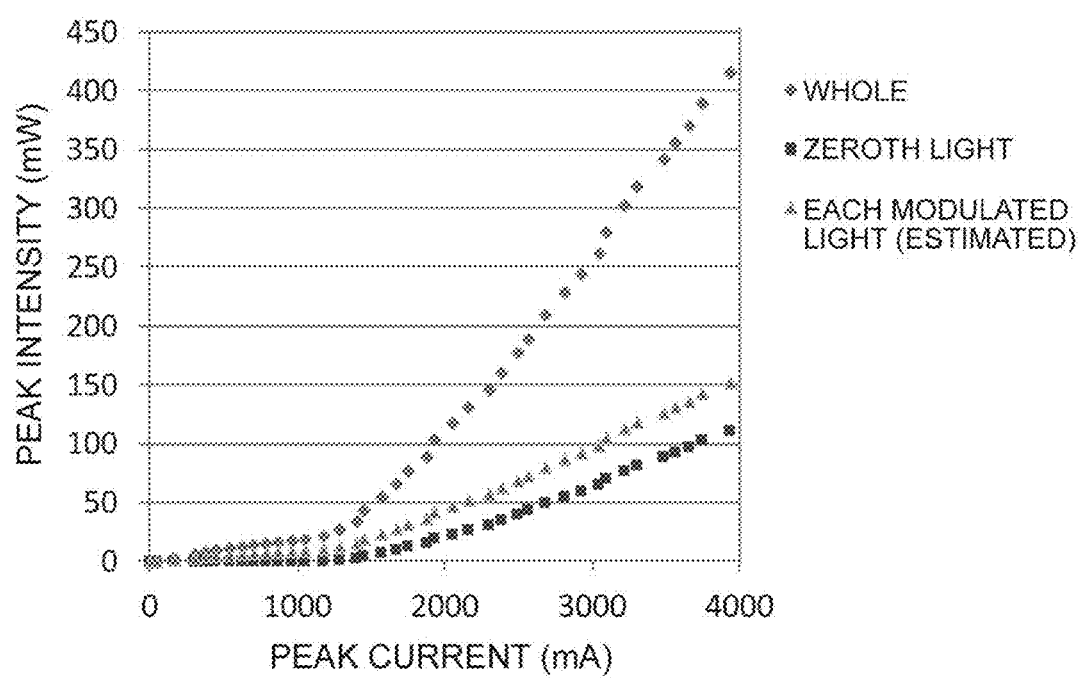
FIG. 28 is a graph showing a relationship between a peak current (mA) and laser light peak intensity (mW) of a laser element corresponding to FIG. 26.

FIG. 28 is a graph showing a relationship between a peak current (mA) and a laser light peak intensity (mW) of a laser element corresponding to FIG. 26.

Data indicated by "whole" in the same drawing is an example in which a power meter light-receiving part was installed, so that the whole output light of the laser light is included, and the laser light was measured. Data indicated by "zeroth order light" in the same drawing is an example in which a power meter light-receiving part was installed, so that only the zeroth order light located at the center of the laser light is included, and the laser light was measured. Data indicated by "each modulated light (estimated)" in the same drawing is a value obtained by calculating the above ("whole"−"zeroth order light")/2 and indicates the estimated light intensity of the modulated light.

It can be seen from the same drawing that, as the peak current is increased, the peak intensity of the laser light increases. In addition, from the point where the peak current exceeds 1,200 mA, it can be seen that the whole peak intensity linearly increases with a large slope.

Figure 29:
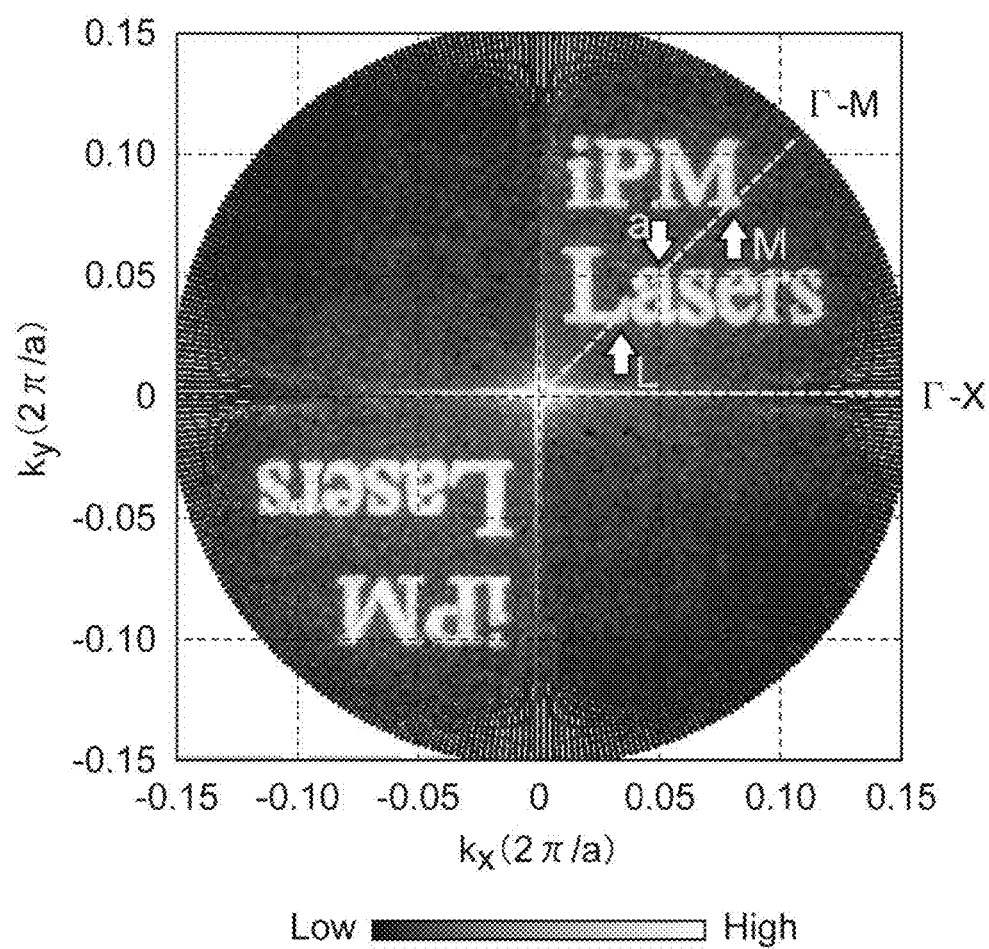
FIG. 29 is a diagram plotted with equal wavelengths at an oscillation wavelength of a result of measuring spectroscopic spectrum/angle dependency of light intensity of a laser element corresponding to FIG. 26.

FIG. 29 is a diagram plotted with equal wavelengths at an oscillation wavelength (930.2 nm) of a result of measuring spectroscopic spectrum/angle dependency of light intensity of a laser element corresponding to FIG. 26.

The character "iPM Lasers" and a character obtained by inverting this character appear in the first quadrant and the third quadrant. From this result, it can be seen that light of the single wavelength corresponding to the oscillation wavelength is emitted in a direction corresponding to the beam pattern illustrated in FIG. 26. That is, it can be seen that the beam pattern is not formed by combining lights of various wavelengths, and a beam pattern having a complicated shape can be realized even with a single wavelength.

Figure 30:
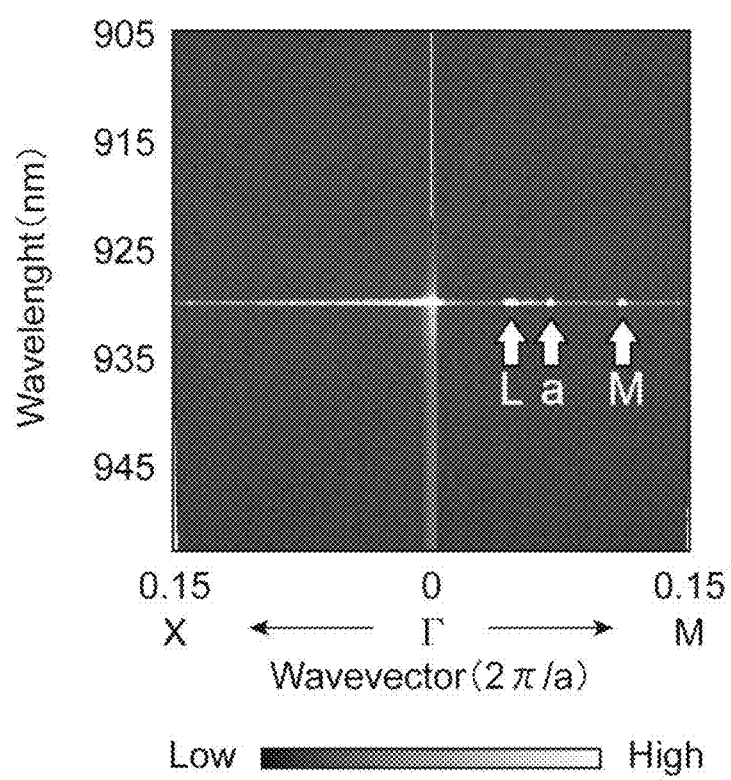
FIG. 30 is a graph showing a relationship between a wave number (2π/a) and a wavelength (nm) in a cross section taken along a Γ-X direction and a Γ-M direction in FIG. 29.

FIG. 30 is a graph showing a relationship between a wave number ($2\pi/a$) and a wavelength (nm) in a cross section taken along a Γ-X direction and a Γ-M direction in FIG. 29 (that is, at the time of oscillation (an applied current of 4 A)). That is, FIG. 30 is a diagram showing which wavelength of light is emitted and in which direction the light is emitted, at the time of laser oscillation. The light of 930.2 nm plotted in. FIG. 29 is emitted in directions corresponding to the characters "L", "a", and "M" on FIG. 29. Light is also emitted on the Γ point.

Figure 31:
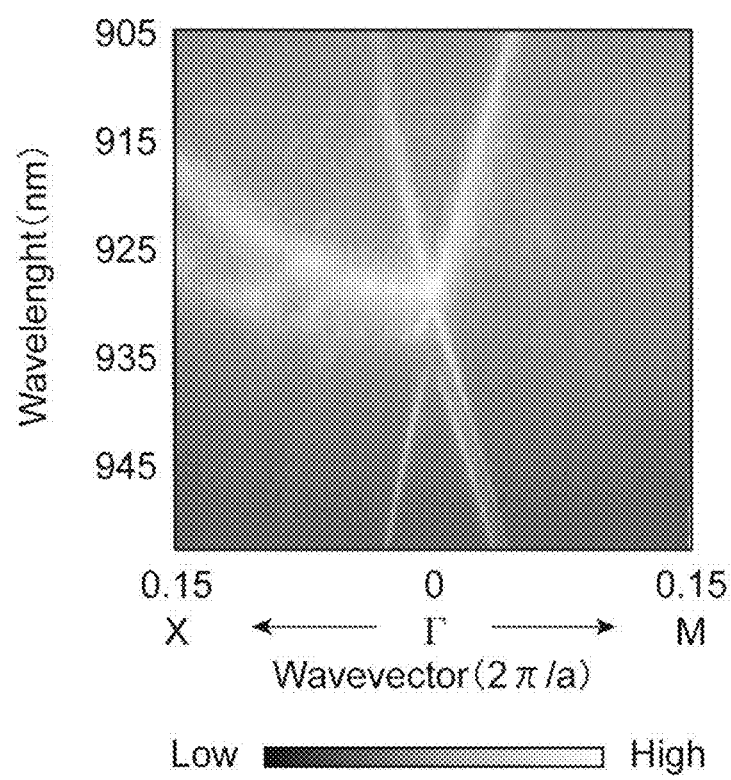
FIG. 31 is a graph showing a measurement result in the relationship between a wave number (2π/a) and a wavelength (nm) in a cross section taken along a F-X direction and a F-M direction before oscillation in the element of FIG. 29.
Figure 32:
FIG. 32 is a diagram illustrating a target pattern.

FIG. 31 is a graph showing a relationship between a wave number ($2\pi/a$) and a wavelength (nm) in a cross section taken along the same direction as in FIG. 30 before oscillation (an applied current of 400 mA). That is, FIG. 31 is a diagram showing which wavelength of light is emitted and in which direction the light is emitted, before laser oscillation. For a periodic structure such as a square lattice, it is a so-called photonic band structure. In the photonic band structure, it is known that a portion with zero inclination is called a band edge and a standing wave is formed at the band edge. Forming the oscillation mode by the light confinement effect due to the periodic structure is basically the band edge. In FIG. 31, the inclination of each band is zero on the Γ point (the part where the wave number on the horizontal axis is 0), and there is a possibility that the oscillation mode will be formed. On the other hand, there are no band edges other than the Γ point, and there is no possibility that the oscillation mode will be formed. In FIG. 30, the band and the band edge do not exist in the portion other than the Γ point among the points where the outgoing light was observed. From this, it can be seen that the oscillation occurs at the Γ point, and a part of the light oscillated at the Γ point is emitted in combination in a direction corresponding to the characters "L", "a", and FIG. 32 is an image of a target pattern and shows a photograph of a person. At this time, the photograph of the person exists in the first quadrant, and there are no patterns in the second quadrant to the fourth quadrant.

Figure 33:
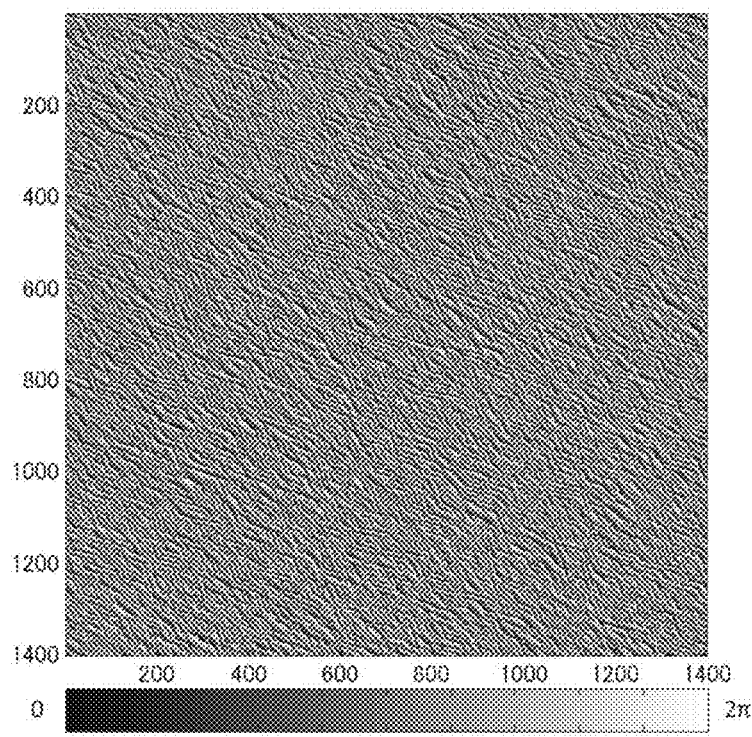
FIG. 33 is a diagram illustrating a phase distribution pattern of a phase modulation layer corresponding to FIG. 32.

FIG. 33 is a diagram illustrating a phase distribution pattern obtained by extracting a phase distribution by two-dimensional Fourier transformation of the image of FIG. 32. FIG. 33 illustrates the distribution of phases of 0 to $2\pi$ according to the shade of color. The part with black color represents a phase of 0. In the present invention, the rotational angle Φ of the hole is determined according to this phase as illustrated in FIG. 5.

1400×1400 holes are disposed in the lattice points of the substantially square lattice in the phase modulation layer, and with respect to the lattice interval (=a) of the square lattice which is virtually set, the distance between the lattice point position and the centroid of the hole is r=0.06a, and the filling factor is FF=20%.

Figure 34:
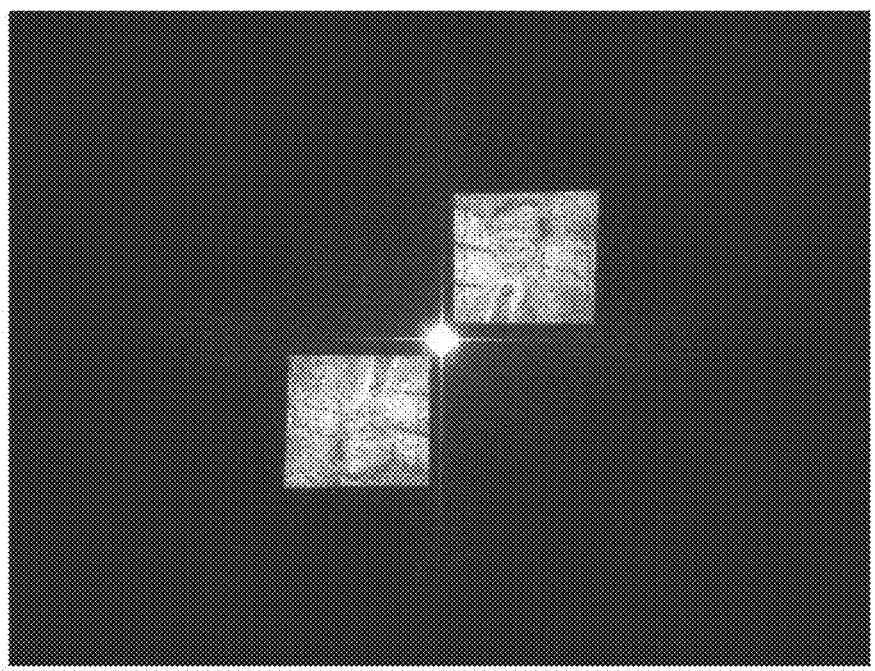
FIG. 34 is a diagram illustrating a beam pattern corresponding to FIG. 32.

FIG. 34 is a photograph showing a beam pattern of a laser element corresponding to FIG. 32.

In this example, the dimension of the second electrode E2 on the p side in the laser element was set to 400 μm×400 μm, and a pulse current of 10 kHz, 50 ns, and 4 A was supplied to the laser element LD of FIG. 2 to drive the laser element.

The image of the person and an image obtained by rotating this image by 180° appear hi the first quadrant and the third quadrant.

Figure 35:
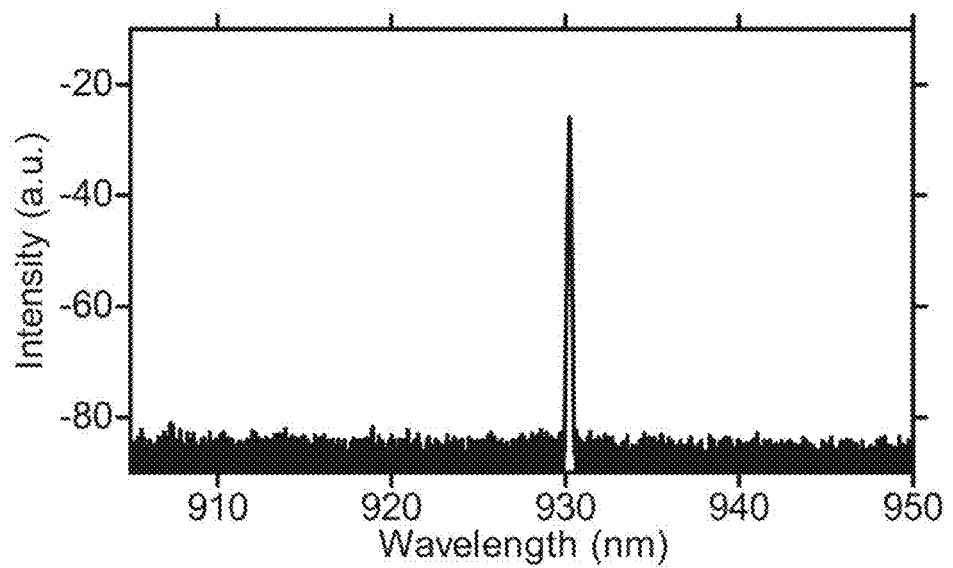
FIG. 35 is a graph showing a relationship between a wavelength and light intensity of a beam pattern of a laser element corresponding to FIG. 32.

FIG. 35 is a photograph showing a relationship between a wavelength and light intensity of a beam pattern of a laser element corresponding to FIG. 32.

An intensity peak of the laser light appears at a position exceeding a wavelength of 930 nm.

Figure 36:
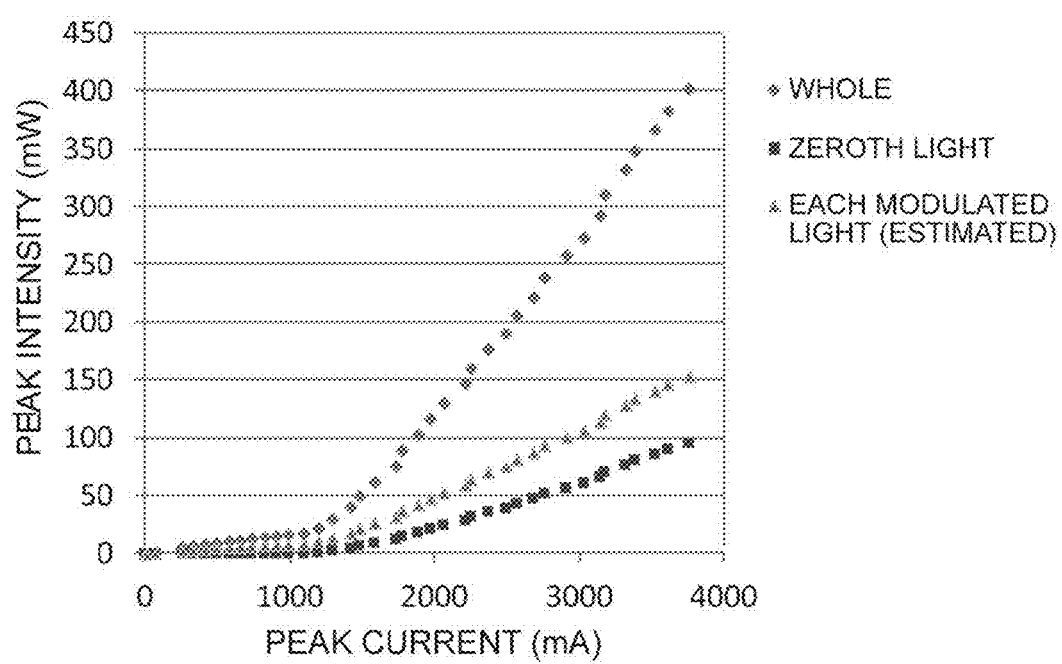
FIG. 36 is a graph showing a relationship between a peak current (mA) and light intensity (mW) of a laser element corresponding to FIG. 34.

FIG. 36 is a graph showing a relationship between a peak current (mA) and a laser light peak intensity (mW) of a laser element corresponding to FIG. 34.

Data indicated by "whole" in the same drawing is an example in which a power meter light-receiving part was installed, so that the whole output light of the laser light is included, and the laser light was measured. Data indicated by "zeroth order light" in the same drawing is an example in which a power meter light-receiving part was installed, so that only the zeroth order light located at the center of the laser light is included, and the laser light was measured. Data indicated by "each modulated light (estimated)" in the same drawing is a value obtained by calculating the above ("whole"–"zeroth order light")/2 and indicates the estimated light intensity of the modulated light.

It can be seen from the same drawing that, as the peak current is increased, the peak intensity of the laser light increases. In addition, from the point where the peak current exceeds 1,000 mA, it can be seen that the whole peak intensity linearly increases with a large slope.

Figure 37:
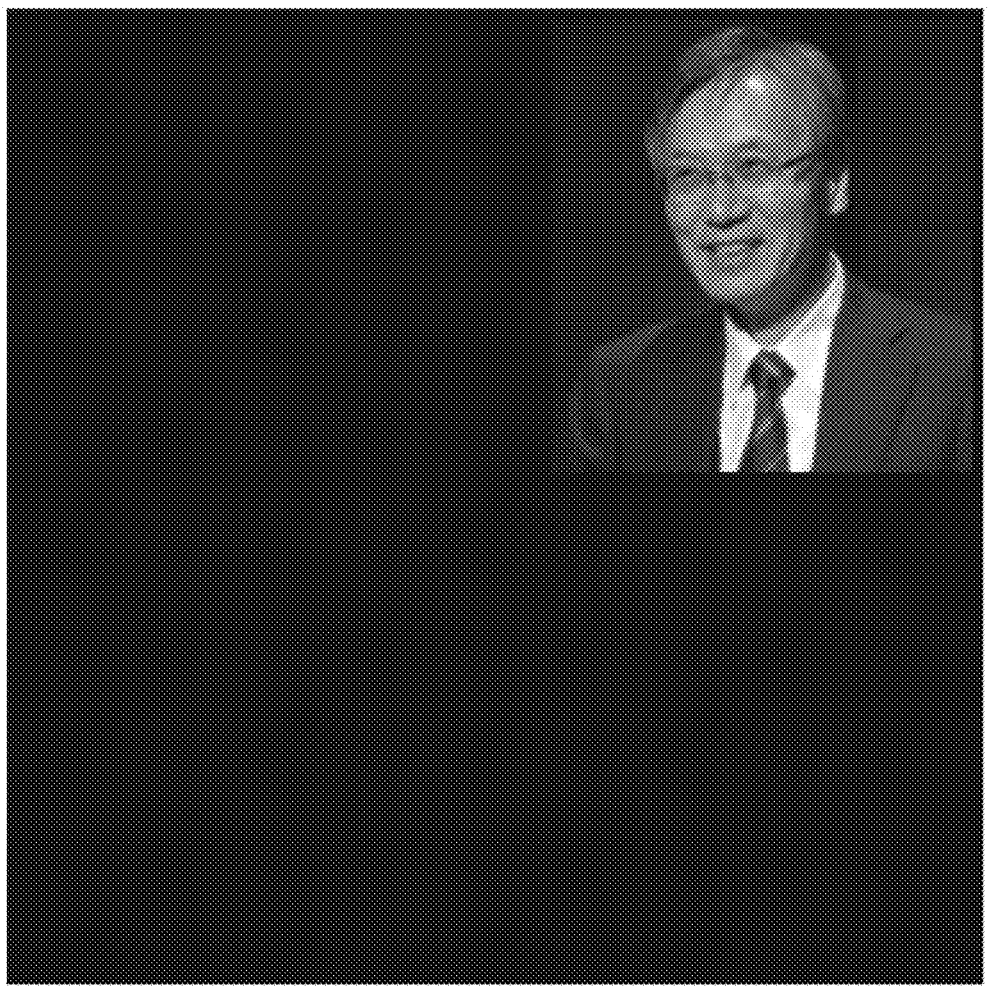
FIG. 37 is a diagram illustrating a target pattern.

FIG. 37 is an image of a target pattern and shows a photograph of a person. At this time, the photograph of the person exists in the first quadrant, and there are no patterns in the second quadrant to the fourth quadrant.

Figure 38:
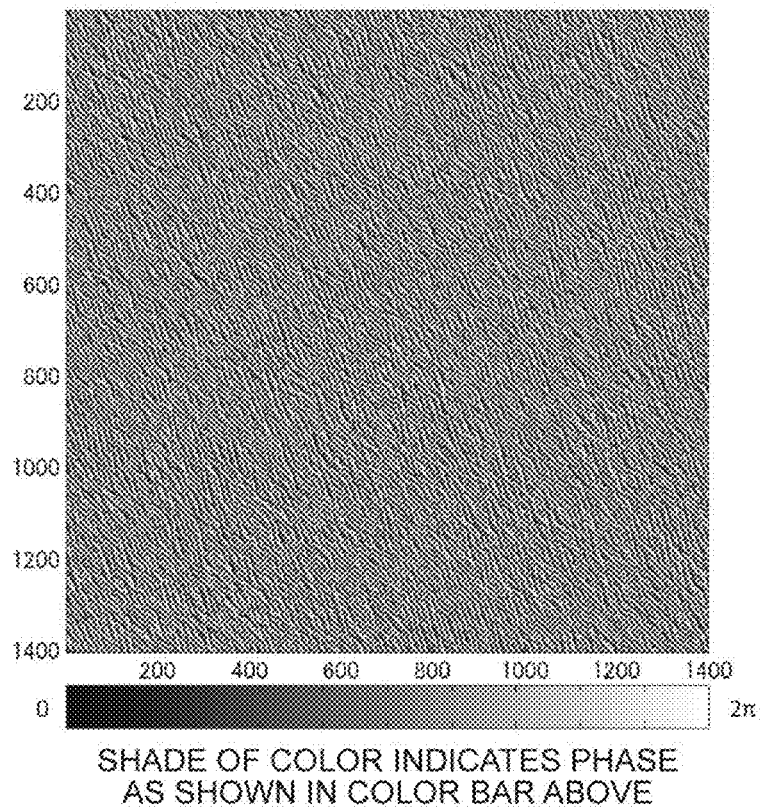
FIG. 38 is a diagram illustrating a phase distribution pattern of a phase modulation layer corresponding to FIG. 37.

FIG. 38 is a diagram illustrating a phase distribution pattern obtained by extracting a phase distribution by two-dimensional Fourier transformation of the image of FIG. 37. FIG. 38 illustrates the distribution of phases of 0 to $2\pi$ according to the shade of color. The part with black color represents a phase of 0. In the present invention, the rotational angle $\Phi$ of the hole is determined according to this phase as illustrated in FIG. 5.

1400×1400 holes are disposed in the lattice points of the substantially square lattice in the phase modulation layer, and with respect to the lattice interval (=a) of the square lattice which is virtually set, the distance between the lattice point position and the centroid of the hole is r=0.06a, and the filling factor is FF=20%.

Figure 39:
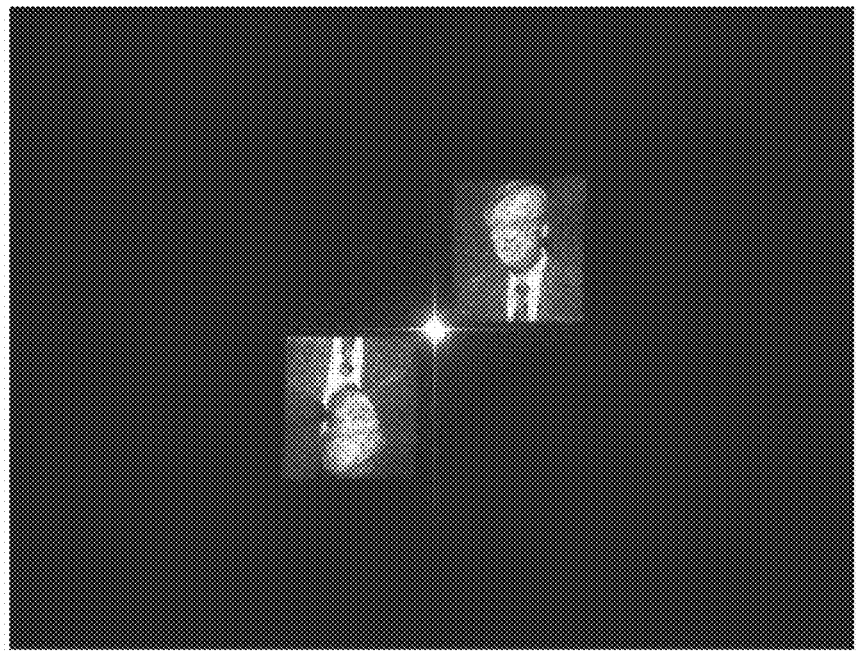
FIG. 39 is a diagram illustrating a beam pattern corresponding to FIG. 37.

FIG. 39 is a photograph showing a beam pattern of a laser element corresponding to FIG. 37.

In this example, the dimension of the second electrode E2 on the p side in the laser element was set to 400 μm×400 μm, and a pulse current of 10 kHz, 50 ns, and 4 A was supplied to the laser element LD of FIG. 2 to drive the laser element. The image of the person and an image obtained by inverting this image appear in the first quadrant and the third quadrant.

Figure 40:
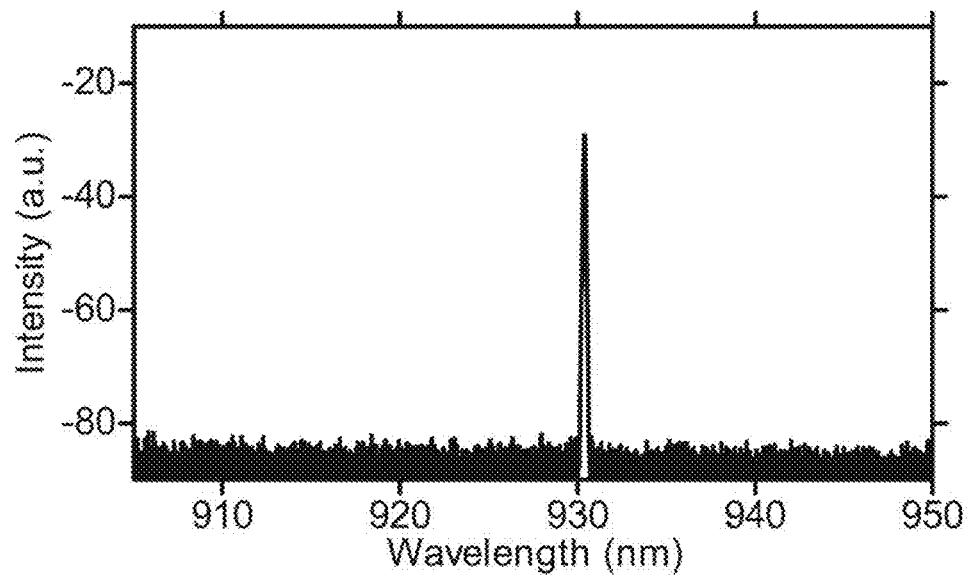
FIG. 40 is a graph showing a relationship between a wavelength and light intensity of a beam pattern of a laser element corresponding to FIG. 37.

FIG. 40 is a photograph showing a relationship between a wavelength and light intensity of a beam pattern of a laser element corresponding to FIG. 37.

An intensity peak of the laser light appears at a position exceeding a wavelength of 930 nm.

Figure 41:
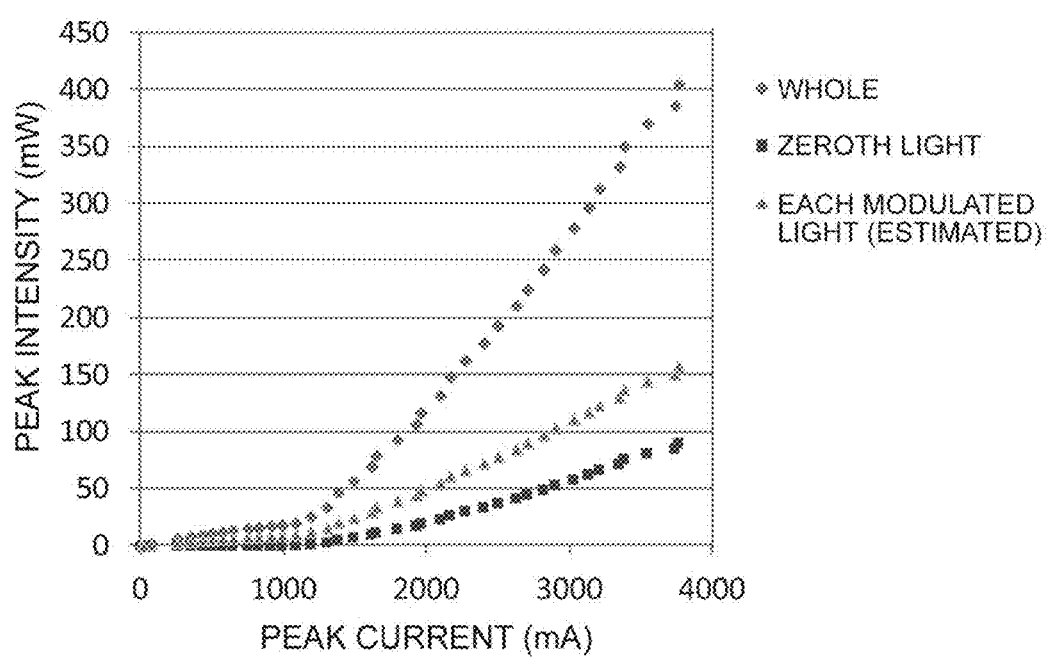
FIG. 41 is a graph showing a relationship between a peak current (mA) and light intensity (mW) of a laser element corresponding to FIG. 39.

FIG. 41 is a graph showing a relationship between a peak current (mA) and a laser light peak intensity (mW) of a laser element corresponding to FIG. 39.

Data indicated by "whole" in the same drawing is an example in which a power meter light-receiving part was installed, so that the whole output light of the laser light is included, and the laser light was measured. Data indicated by "zeroth order light" in the same drawing is an example in which a power meter light-receiving part was installed, so that only the zeroth order light located at the center of the laser light is included, and the laser light was measured. Data indicated by "each modulated light (estimated)" in the same drawing is a value obtained by calculating the above ("whole"–"zeroth order light")/2 and indicates the estimated light intensity of the modulated light.

It can be seen from the same drawing that, as the peak current is increased, the peak intensity of the laser light increases. In addition, from the point where the peak current exceeds 1,000 mA, it can be seen that the whole peak intensity linearly increases with a large slope.

Figure 42:
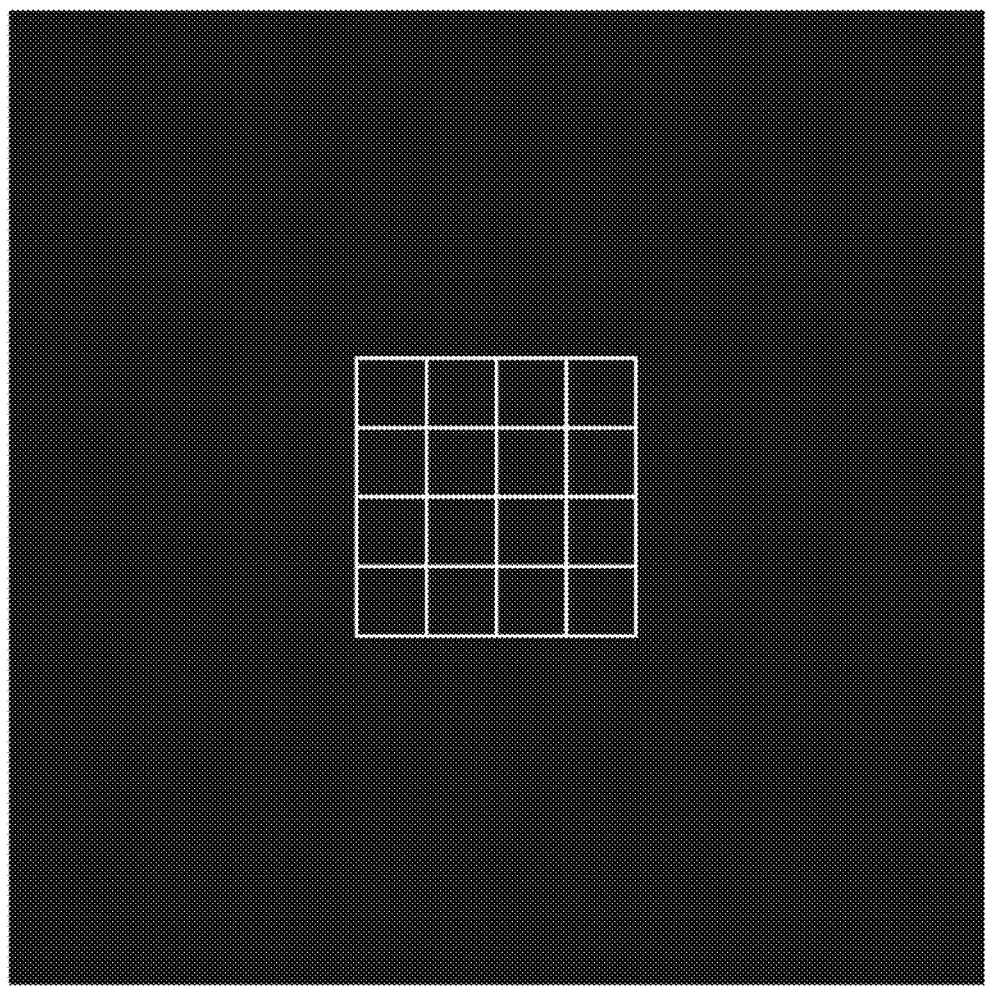
FIG. 42 is a diagram illustrating a target pattern.

FIG. 42 is an image of a target pattern and shows a lattice pattern. At this time, the lattice pattern is present in the center. The lattice pattern includes a straight line, and this is a figure and can be a photograph or may be created by computer graphics (CG).

Figure 43:
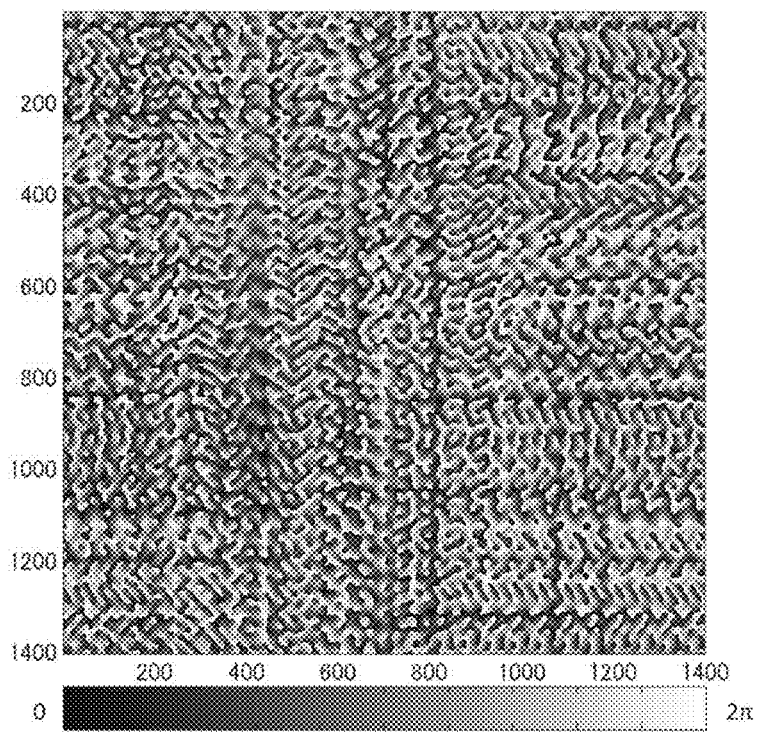
FIG. 43 is a diagram illustrating a phase distribution pattern of a phase modulation layer corresponding to FIG. 42.

FIG. 43 is a diagram illustrating a phase distribution pattern obtained by extracting a phase distribution by two-dimensional Fourier transformation of the image of FIG. 42. FIG. 43 illustrates the distribution of phases of 0 to $2\pi$ according to the shade of color. The part with black color represents a phase of 0. In the present invention, the rotational angle $\Phi$ of the hole is determined according to this phase as illustrated in FIG. 5.

1400×1400 holes are disposed in the lattice points of the substantially square lattice in the phase modulation layer, and with respect to the lattice interval a) of the square lattice which is virtually set, the distance between the lattice point position and the centroid of the hole is r=0.10a, and the filling factor is FF=20%.

Figure 44:
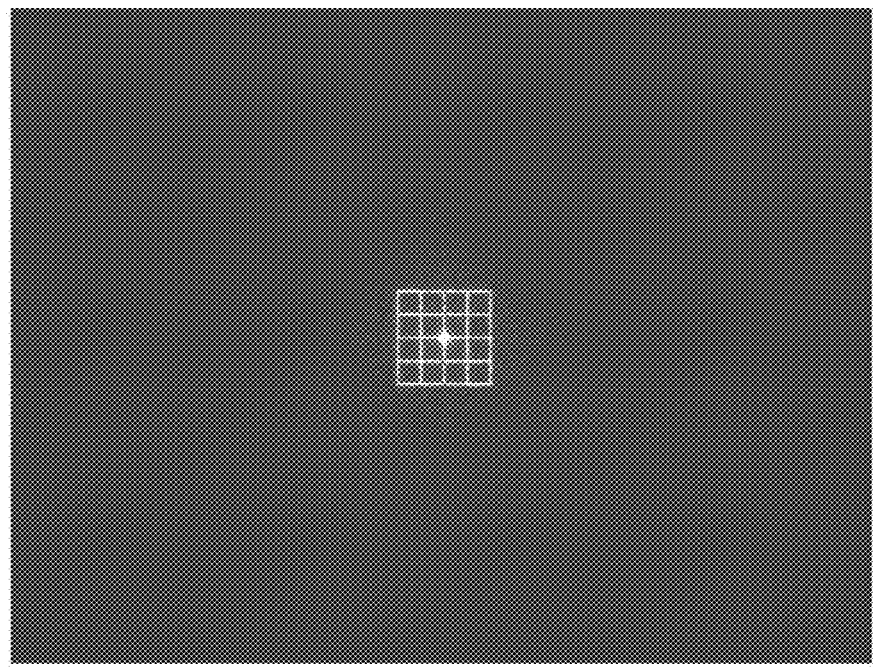
FIG. 44 is a diagram illustrating a beam pattern corresponding to FIG. 42.

FIG. 44 is a photograph showing a beam pattern of a laser element corresponding to FIG. 42.

In this example, the dimension of the second electrode E2 on the p side in the laser element was set to 400 μm×400 μm, and a pulse current of 10 kHz, 50 ns, and 4 A was supplied to the laser element LD of FIG. 2 to drive the laser element. The lattice pattern appears in the center.

Figure 45:
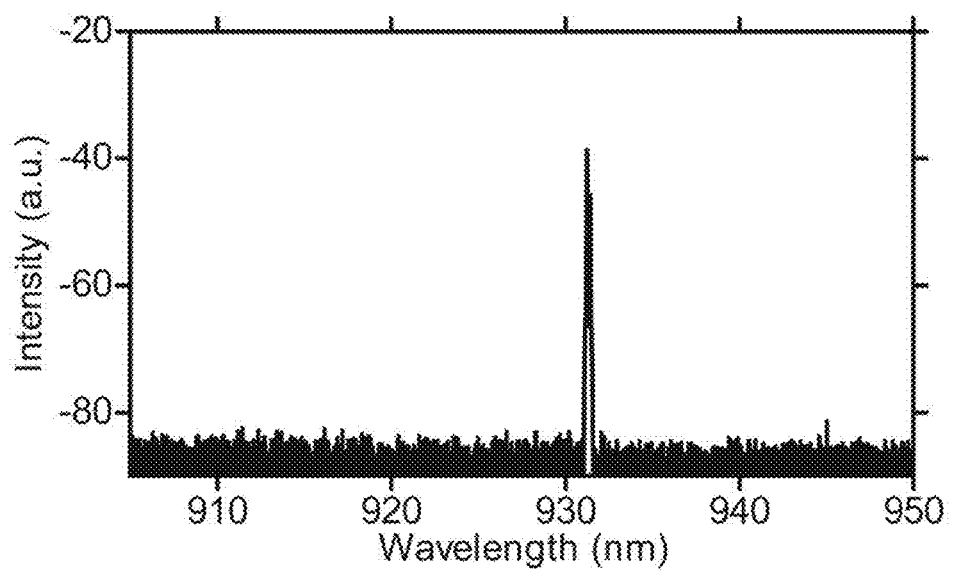
FIG. 45 is a graph showing a relationship between a wavelength and light intensity of a beam pattern of a laser element corresponding to FIG. 42.

FIG. 45 is a photograph showing a relationship between a wavelength and light intensity of a beam pattern of a laser element corresponding to FIG. 42.

An intensity peak of the laser light appears at a position exceeding a wavelength of 930 nm.

Figure 46:
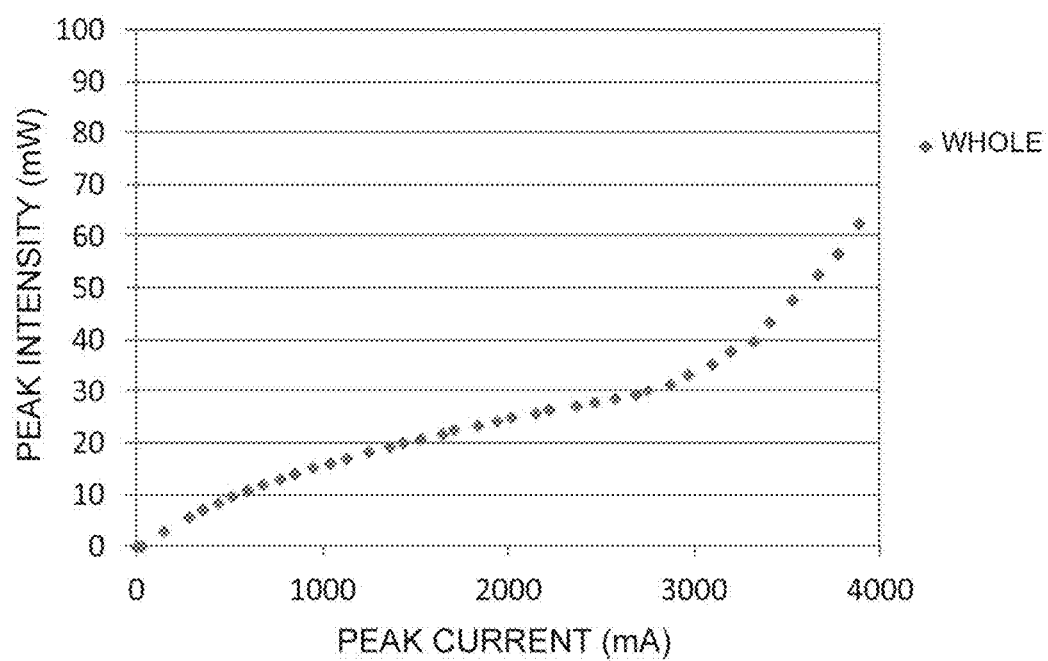
FIG. 46 is a graph showing a relationship between a peak current (mA) and light intensity (mW) of a laser element corresponding to FIG. 44.

FIG. 46 is a graph showing a relationship between a peak current (mA) and a laser light peak intensity (mW) of a laser, element corresponding to FIG. 44.

Data indicated by "whole" in the same drawing is an example in which a power meter light-receiving part was installed, so that the whole output light of the laser light is included, and the laser light was measured.

It can be seen from the same drawing that, as the peak current is increased, the peak intensity of the laser light increases. In addition, from the point where the peak current exceeds 3,000 mA, it can be seen that the whole peak intensity linearly increases with a large slope.

Figure 47:
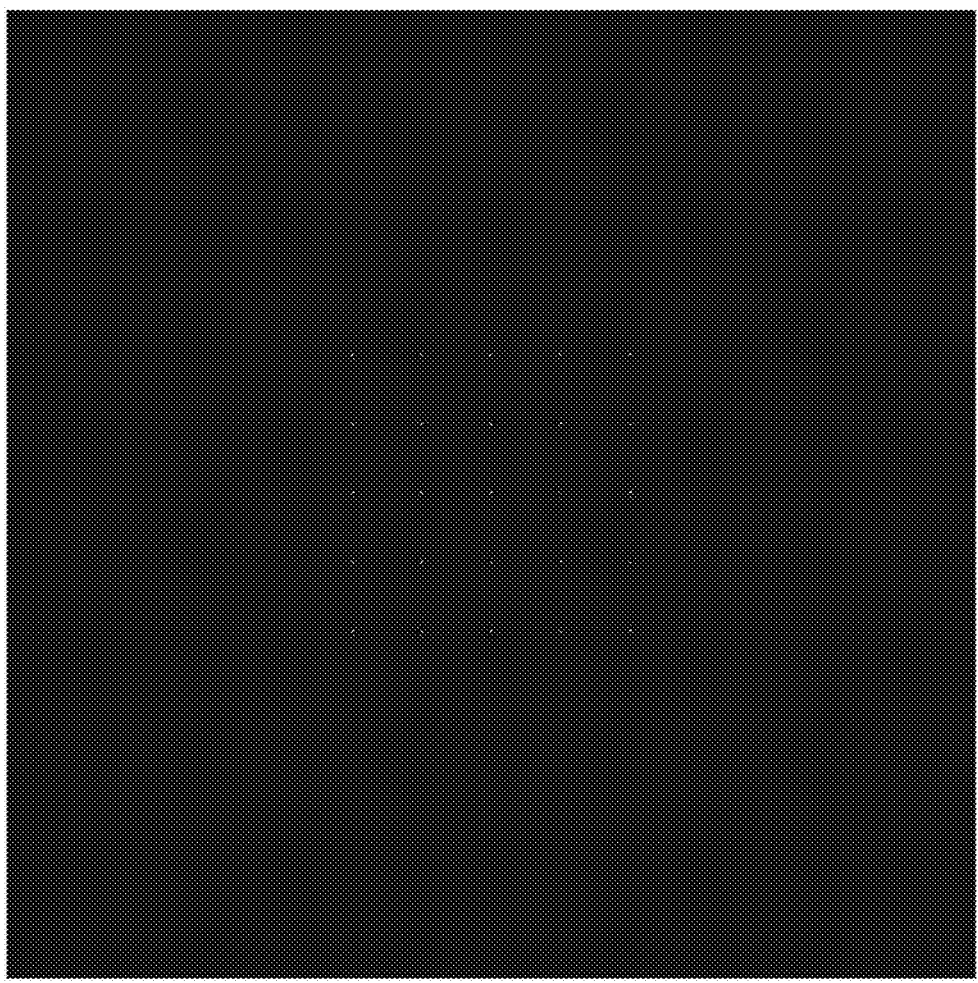
FIG. 47 is a diagram illustrating a target pattern.

FIG. 47 is an image of a target pattern and illustrates a multi-point pattern including a plurality of spots (dots) disposed at lattice point positions of a virtual square lattice. Five dots are shown vertically and five dots are shown horizontally. That is, a total of 25 dots are shown. In this case, the multi-point pattern is present in the center.

Figure 48:
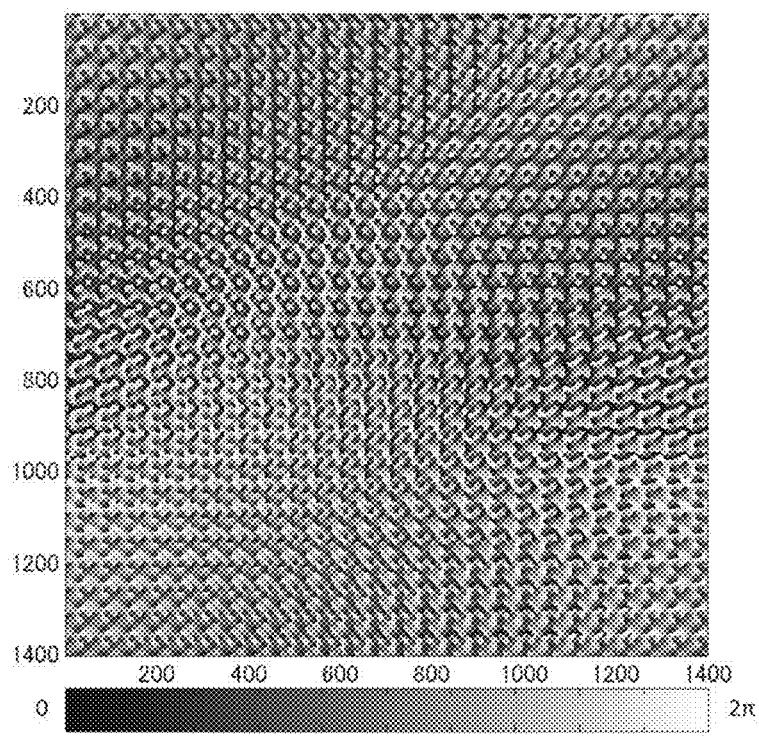
FIG. 48 is a diagram illustrating a phase distribution pattern of a phase modulation layer corresponding to FIG. 47.

FIG. 48 is a diagram illustrating a phase distribution pattern obtained by extracting a phase distribution by two-dimensional Fourier transformation of the image of FIG. 47. FIG. 48 illustrates the distribution of phases of 0 to $2\pi$ according to the shade of color. The part with black color represents a phase of 0. In the present invention, the rotational angle Φ of the hole is determined according to this phase as illustrated in FIG. 5.

1400×1400 holes are disposed in the lattice points of the substantially square lattice in the phase modulation layer, and with respect to the lattice interval (=a) of the square lattice which is virtually set, the distance between the lattice point position and the centroid of the hole is r=0.10a, and the filling factor is FF=20%.

Figure 49:
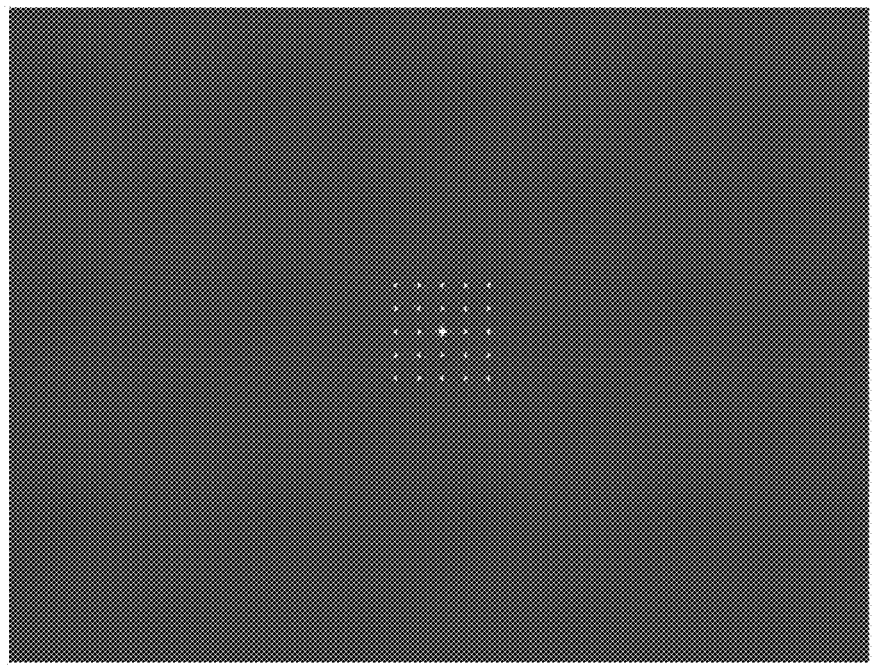
FIG. 49 is a diagram illustrating a beam pattern corresponding to FIG. 47.

FIG. 49 is a photograph showing a beam pattern of a laser element corresponding to FIG. 47.

In this example, the dimension of the second electrode E2 on the p side in the laser element was set to 400 μm×400 μm, and a pulse current of 10 kHz, 50 ns, and 4 A was supplied to the laser element LD of FIG. 2 to drive the laser element. The multi-point pattern appears in the center.

Figure 50:
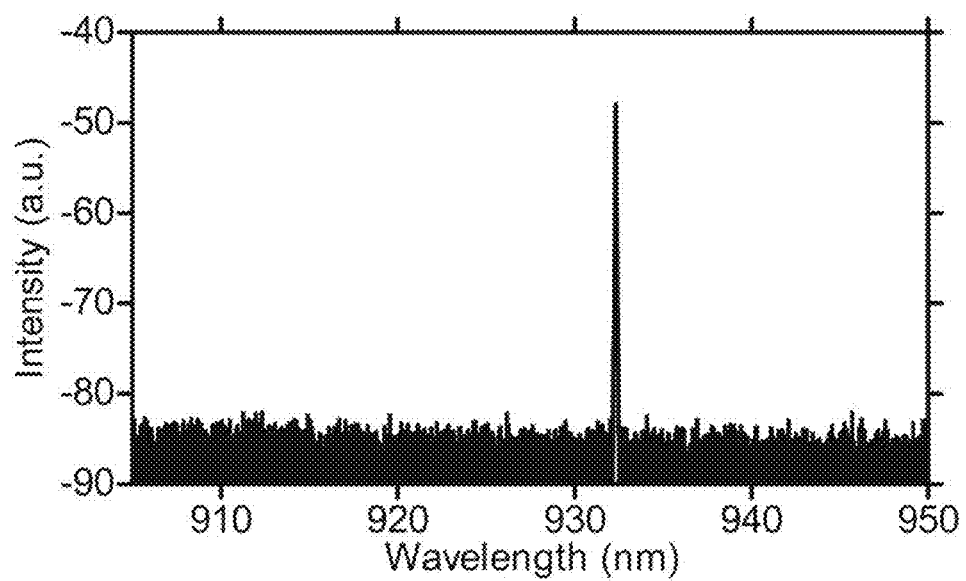
FIG. 50 is a graph showing a relationship between a wavelength and light intensity of a beam pattern of a laser element corresponding to FIG. 47.

FIG. 50 is a photograph showing a relationship between a wavelength and light intensity of a beam pattern of a laser element corresponding to FIG. 47.

An intensity peak of the laser light appears at a position exceeding a wavelength of 930 nm.

Figure 51:
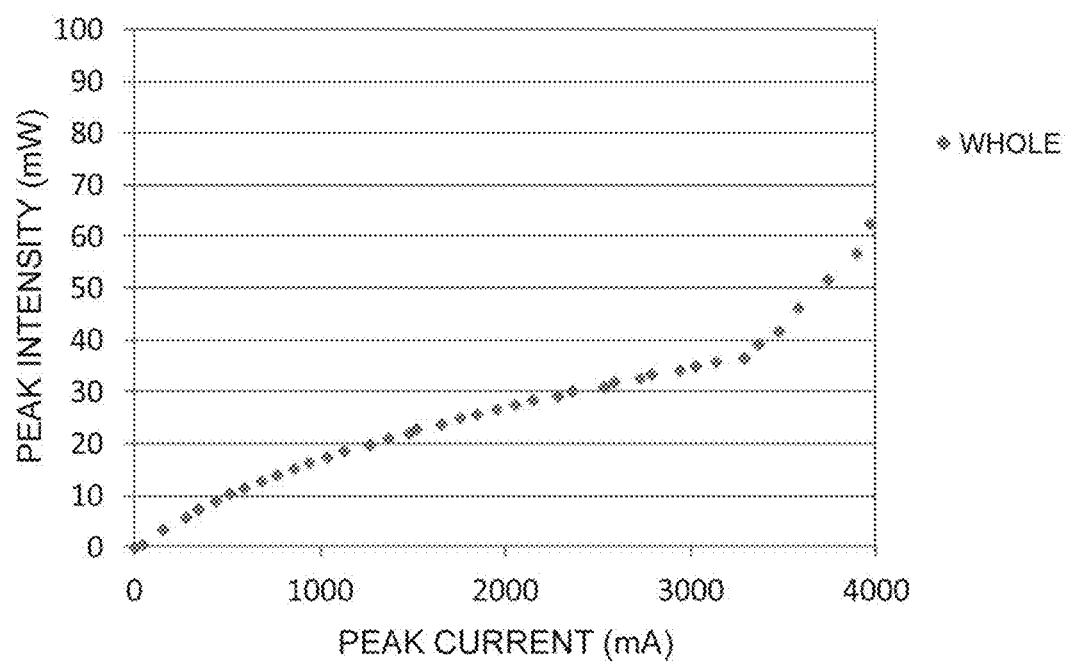
FIG. 51 is a graph showing a relationship between a peak current (mA) and light intensity (mW) of a laser element corresponding to FIG. 49.

FIG. 51 is a graph showing a relationship between a peak current (mA) and a laser light peak intensity (mW) of a laser element corresponding to FIG. 49.

Data indicated by "whole" in the same drawing is an example in which a power meter light-receiving part was installed, so that the whole output light of the laser light is included, and the laser light was measured.

It can be seen from the same drawing that, as the peak current is increased, the peak intensity of the laser light increases. In addition, from the point where the peak current exceeds 3,000 mA, it can be seen that the whole peak intensity linearly increases with a large slope.

As described above, the beam pattern emitted from the semiconductor light emitting element can include at least one: spot, straight line, cross, lattice pattern, figure, photograph, computer graphics (CG), or character.

REFERENCE SIGNS LIST

6 Phase modulation layer
6A base layer
6B different refractive index region

What is claimed is:

1. A semiconductor light emitting element comprising:
an active layer;
a pair of cladding layers between which the active layer is interposed; and
a phase modulation layer optically coupled to the active layer,
wherein the phase modulation layer comprises:
a base layer; and
a plurality of different refractive index regions having different refractive indices from the base layer,
wherein when an XYZ orthogonal coordinate system having a thickness direction of the phase modulation layer as a Z-axis direction is set and a square lattice of a virtual lattice constant a is set in an XY plane,
wherein each of the different refractive index regions is disposed so that a centroid position thereof is shifted from a lattice point position in the virtual square lattice by a distance r,
wherein in the phase modulation layer, all the different refractive index regions have, in the XY plane, same distance r,
wherein a shape of each of the different refractive index regions in the XY plane is a square, a regular hexagon, a regular octagon, or a regular hexadecagon,
wherein the distance r satisfies 0<r≤0.3a,
wherein a beam pattern emitted from the semiconductor light emitting element includes at least one:
straight line,
cross,
figure,
photograph,
computer graphics (CG),
lattice pattern, or
character,
wherein a complex amplitude F(X, Y) obtained by performing two-dimensional Fourier transformation on a specific region of the beam pattern in the XY plane is expressed as follows, by using an intensity distribution I(X, Y) in the XY plane and a phase distribution P(X, Y) in the XY plane, with j as an imaginary unit:

$$F(X,Y)=I(X,Y)\times\exp\{P(X,Y)j\}, \text{ and}$$

wherein, in the phase modulation layer,
when φ is an angle formed by an X axis and a direction from each lattice point of the virtual square lattice to the centroid of the corresponding different refractive index region, a constant is C, (x, y) is a position of a virtual square lattice point at an $x^{th}$ position in an X-axis direction and a $y^{th}$ position in a Y-axis direction, and φ(x, y) is an angle at a position (x, y), $$\varphi(x,y)=C\times P(X,Y).$$

2. The semiconductor light emitting element according to claim 1, wherein, when an effective refractive index of the phase modulation layer is n,
a wavelength $\lambda_0$ (=a×n) selected by the phase modulation layer falls within an emission wavelength range of the active layer.

3. The semiconductor light emitting element according to claim 1, wherein, when an effective refractive index of the phase modulation layer is n,
a wavelength $\lambda_0$ (=$2^{0.5}$×a×n) selected by the phase modulation layer falls within an emission wavelength range of the active layer.

4. The semiconductor light emitting element according to claim 1, wherein, in the phase modulation layer, all the different refractive index regions have, in the XY plane,
same figure, and/or
same area,
wherein the plurality of different refractive index regions are capable of being overlapped by a translating operation, or a translating operation and a rotating operation.

5. The semiconductor light emitting element according to claim 1, wherein a shape of each of the different refractive index regions in the XY plane has a rotational symmetry.

6. The semiconductor light emitting element according to claim 1, wherein the shape of each of the different refractive index regions in the XY plane is a perfect circle, a square, a regular hexagon, a regular octagon, or a regular hexadecagon.

7. The semiconductor light emitting element according to claim 1, wherein the shape of each of the different refractive index regions in the XY plane has a mirror image symmetry.

8. The semiconductor light emitting element according to claim 1, wherein the shape of each of the different refractive index regions in the XY plane is
a rectangle,
an ellipse, or
a shape in which a part of two circles or ellipses overlap each other.

9. The semiconductor light emitting element according to claim 1, wherein the shape of each of the different refractive index regions in the XY plane is
- a trapezoidal shape,
- a shape in which a dimension in a minor axis direction in the vicinity of one end portion along a major axis of an ellipse is deformed so as to be smaller than a dimension in a minor axis direction in the vicinity of another end portion, or
- a shape in which one end portion along a major axis of an ellipse is deformed to a pointed end protruding along a major axis direction thereof.

10. The semiconductor light emitting element according to claim 1, comprising:
- an inner region including the different refractive index regions arranged substantially periodically for emitting a target beam pattern; and
- an outer region surrounding the inner region, including different refractive index regions whose the respective centroid positions coincide with the lattice point positions of a square lattice.

11. The semiconductor light emitting element according to claim 1,
wherein a filling factor of the different refractive index regions is defined by FF,
wherein the distance r satisfies:

$$r < -0.6a*FF + 0.3a.$$

12. The semiconductor light emitting element according to claim 1,
wherein a filling factor of the different refractive index regions is defined by FF,
wherein the distance r satisfies:

$$r < -0.611a*FF + 0.275a.$$

13. The semiconductor light emitting element according to claim 1,
wherein a filling factor of the different refractive index regions is defined by FF,
wherein the distance r satisfies:

$$r < -0.625a*FF + 0.25a.$$

* * * * *